United States Patent
Iguchi

(10) Patent No.: US 10,763,180 B2
(45) Date of Patent: Sep. 1, 2020

(54) IMAGE DISPLAY DEVICE

(71) Applicant: SHARP KABUSHIKI KAISHA, Sakai, Osaka (JP)

(72) Inventor: Katsuji Iguchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/545,316

(22) Filed: Aug. 20, 2019

(65) Prior Publication Data

US 2019/0378770 A1 Dec. 12, 2019

Related U.S. Application Data

(62) Division of application No. 15/759,181, filed as application No. PCT/JP2016/072484 on Aug. 1, 2016, now Pat. No. 10,453,759.

(30) Foreign Application Priority Data

Sep. 11, 2015 (JP) ................................. 2015-179405

(51) Int. Cl.
*H01L 27/15* (2006.01)
*G09C 3/00* (2006.01)
(Continued)

(52) U.S. Cl.
CPC ............ *H01L 22/14* (2013.01); *G09G 3/006* (2013.01); *H01L 22/34* (2013.01);
(Continued)

(58) Field of Classification Search
CPC ............... G09G 3/006; G09G 2330/10; G09G 2330/12; H01L 27/156
(Continued)

(56) References Cited

U.S. PATENT DOCUMENTS

| 2002/0064032 A1 | 5/2002 | Oohata |
| 2005/0233504 A1 | 10/2005 | Doi et al. |
| 2009/0278142 A1 | 11/2009 | Watanabe et al. |

FOREIGN PATENT DOCUMENTS

| JP | 2002-118124 A | 4/2002 |
| JP | 2003-140572 A | 5/2003 |

(Continued)

OTHER PUBLICATIONS

"Sony Develops Next-generation Display, 'Crystal LED Display,' Ideal for High Picture Quality on Large screens," [online], Jan. 10, 2012, Internet < URL:http://www.sony.co.jp/SonyInfo/News/Press/201201/12-005/>.

(Continued)

*Primary Examiner* — David Vu
*Assistant Examiner* — Brandon C Fox
(74) *Attorney, Agent, or Firm* — ScienBiziP, P.C.

(57) ABSTRACT

A base substrate include a first substrate (110) having a first principal surface (110a) and a second principal surface (110b), and a first wiring member placed over the first or second principal surface. A pixel substrate includes a second substrate (201) having a third principal surface (201a) and a fourth principal surface (201b), a plurality of light-emitting elements (202) mounted over the third principal surface, a driver IC (205) mounted over the third principal surface, an external connection terminal mounted over the third principal surface, and a second wiring member (206) placed on the third or fourth principal surface. The driver IC drives the plurality of light-emitting elements. The external connection terminal receives an input signal that is supplied from outside the pixel substrate. The second substrate (201) is disposed to be stacked on top of the first substrate (110) so that the first principal surface and the fourth principal surface face each other. The second wiring member is (Continued)

electrically connected to the first wiring member by a via hole (215).

20 Claims, 24 Drawing Sheets

(51) Int. Cl.
*H01L 21/66* (2006.01)
*G09G 3/00* (2006.01)
*H01L 25/075* (2006.01)
*H01L 33/50* (2010.01)
*H01L 33/62* (2010.01)

(52) U.S. Cl.
CPC ........ *H01L 25/0753* (2013.01); *H01L 27/156* (2013.01); *H01L 22/32* (2013.01); *H01L 33/504* (2013.01); *H01L 33/62* (2013.01)

(58) Field of Classification Search
USPC .................................................... 257/48, 81
See application file for complete search history.

(56) References Cited

FOREIGN PATENT DOCUMENTS

| | | |
|---|---|---|
| JP | 4082242 B2 | 4/2008 |
| JP | 2009-177117 A | 8/2009 |
| JP | 4479827 B2 | 6/2010 |
| JP | 4491948 B2 | 6/2010 |
| JP | 3184450 U | 6/2013 |

OTHER PUBLICATIONS

Notice of Allowance and Fee(s) Due dated Jun. 12, 2019 for U.S. Appl. No. 15/759,181.

FIG. 7
(1) A-A CROSS-SECTION
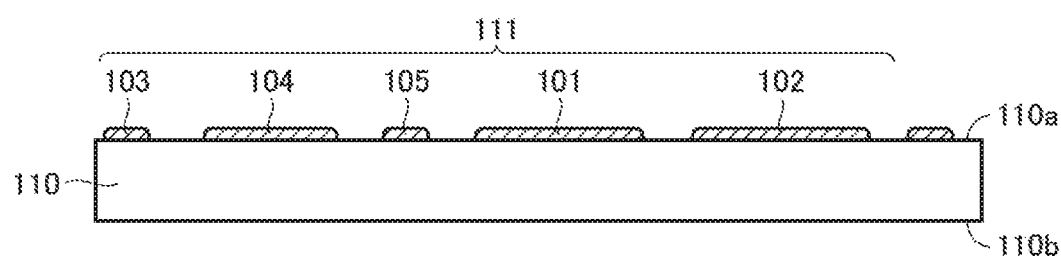
(2) B-B CROSS-SECTION
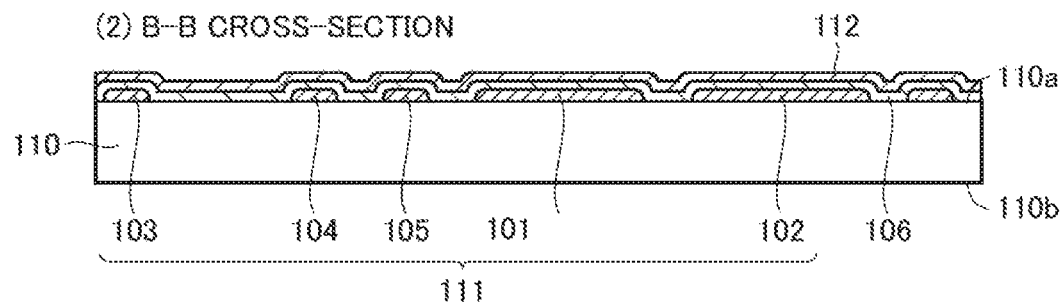

C-C CROSS-SECTION

FIG. 11
(1) A-A CROSS-SECTION
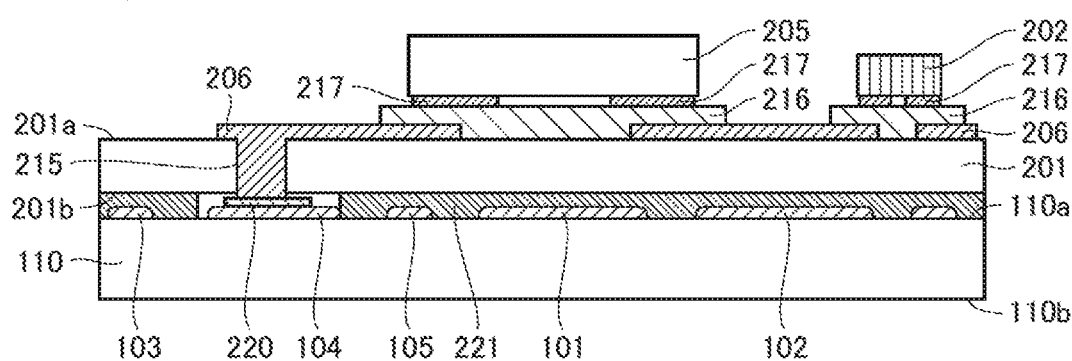
(2) B-B CROSS-SECTION
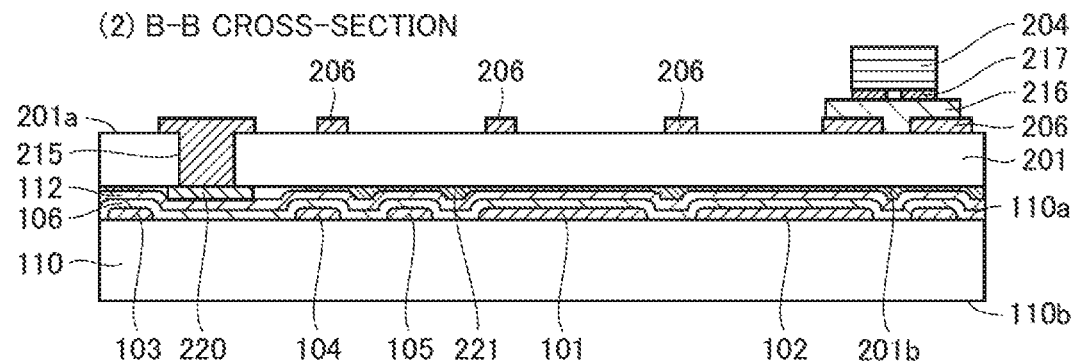

FIG. 12 (1) REMOVAL OF DEFECTIVE PIXEL SECTIONS
(PIXEL SUBSTRATE INSPECTING STEP)
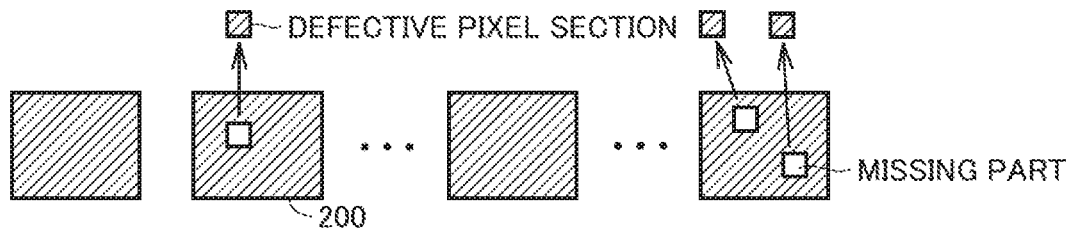
(2) PASTING OF PIXEL SUBSTRATES (BONDING STEP)
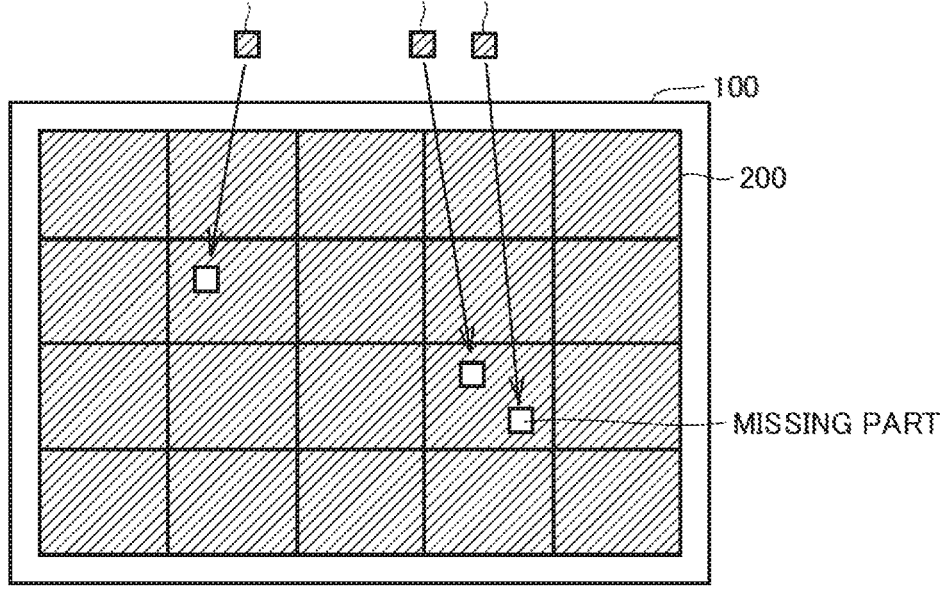
(3) FILLING OF DEFECTIVE PIXEL SECTIONS (BONDING STEP)
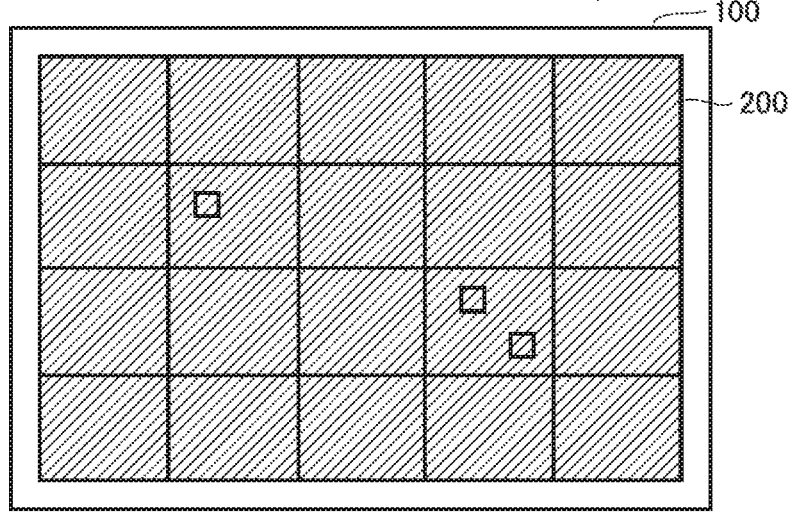

IMAGE DISPLAY DEVICE

TECHNICAL FIELD

The present invention relates to an image display device formed by two-dimensionally arraying a plurality of pixel sections.

The present disclosure contains subject matter related to that disclosed in Japanese Patent Application No. 2015-179405 filed in the Japan Patent Office on Sep. 11, 2015, the entire contents of which are hereby incorporated by reference.

BACKGROUND ART

Known flat-screen image display devices (hereinafter also referred to as "displays") are based on a liquid crystal system, an organic EL (electroluminescence) system, or an inorganic EL system.

The liquid crystal system is limited in contrast, as it forms an image from white light from a backlight with a liquid-crystal shutter and a color filter. Further, the liquid crystal system tends to be high in power consumption, as it is low in efficiency in the use of light. Furthermore, the liquid crystal system is narrow in its color gamut, as the red (R), green (G), and blue (B) color filter has such a wide transmission band that there is an overlap with an adjacent band.

On the other hand, the organic EL system is superior to the liquid crystal system in terms of contrast, power consumption, and color purity. However, since the organic EL system is more difficult to manufacture than the liquid crystal system, the organic EL system has yet to be sold on a full scale. It should be noted that although the sale of an organic EL display including a combination of a white EL and a color filter has recently been launched, such an organic EL display shows no profound improvements in its color gamut and power consumption, albeit with improved contrast.

The inorganic EL system is a system in which an image is formed by light-emitting elements formed by compound semiconductors, configured to emit RGB colors of light, and spread all over a screen. Inorganic EL displays are being put into practical use as supersized displays on racetracks, in stadiums, and elsewhere. For example, in the International Consumer Electronics Show held in the United States in 2012, a test model of the 55-inch full high-definition standard called "Crystal LED Display" was displayed (see, for example, NPL 1).

Since liquid crystal displays and organic EL displays each include a glass substrate, a thin-film transistor formed on the glass substrate, and a liquid crystal or organic EL layer formed on the thin-film transistor, larger displays lead to more complicated steps, undesirably resulting in lower yield rates and higher prices. Further, a thick glass substrate is needed to ensure heat resistance and strength that are necessary to the conduct of a thin-film process, undesirably resulting in a heavier display. To address these problems, an attempt to form a display on a flexible resin substrate has been made but is currently a far cry from commercialization. Further, an attempt to form a thin-film transistor on a resin substrate has also been launched but has not reached a practicable level.

Meanwhile, since inorganic EL displays are superior in performance than light crystal displays and organic EL displays, there have so far been proposed various method for producing an inorganic EL display. However, since a practical structure suited to mass production has yet to be achieved, a shift to mass production has yet to made.

As a method for producing an inorganic EL display, Japanese Patent No. 4082242 (PTL 1) discloses, for example, a method including placing LED (light-emitting device) chips on a temporary holding substrate, embedding the LED chips into an adhesive layer of a transfer substrate, hardening the adhesive layer, forming a wiring layer, pasting a supporting substrate to the adhesive layer again, peeling the transfer substrate, boring a contact hole through the adhesive layer, forming another wire, and thereby forming an LED chip array on the supporting substrate.

Further, Japanese Patent No. 4491948 (PTL 2) discloses a method including performing a thinning-out transfer with a laser irradiation peeling technique from a microchip array in which LED chips are arrayed, thereby forming, on another substrate, LED chips arrayed at enlarged pitches of substantially an integral multiple of chip size, and retransferring these LED chips onto a supporting substrate.

Japanese Patent No. 4479827 (PTL 3) includes peeling, from a substrate for use in compound semiconductor growth, LED chips formed with p-side electrodes, transferring the LED chips into a temporary fixing substrate, further forming n-side electrodes on the temporary fixing substrate, and performing a thinning-out transfer onto a relay substrate with a laser peeling technique. The R, G, and B LED chips thus arrayed are transferred onto a first transfer substrate to form a pixel array, and on this substrate, transparent electrodes and n-side metal wires are formed. Furthermore, after a transfer from the first transfer substrate to a light-emitting unit substrate, through which p-side contact holes are bored and on which p-side wires are formed, the light-emitting unit substrate is pasted to a substrate for display device via a second transfer substrate. With a driving wiring layer formed over the substrate for display device, a display device is completed through a contact hole forming step and a wiring step for connecting, to driving wires, the p-side wires and n-side wires connected to the LED chips.

CITATION LIST

Patent Literature

PTL 1: Japanese Patent No. 4082242
PTL 2: Japanese Patent No. 4491948
PTL 3: Japanese Patent No. 4479827

Non Patent Literature

NPL 1: "Sony Develops Next-generation Display, 'Crystal LED Display,' Ideal for High Picture Quality on Large screens," [online], Jan. 10, 2012, Internet <URL:http://www.sony.co.jp/SonyInfo/News/Press/201201/12-005/>

SUMMARY OF INVENTION

Technical Problem

The production methods disclosed in PTLs 1 to 3 listed above have the following technical problems.

First, since it is necessary to execute steps such as contact hole formation and wire formation more than once on a screen-sized substrate, it is essential to execute glass substrate steps such as photolithography, dry etching, and thin-film deposition on a hard substrate such as a glass substrate. Therefore, it is difficult to form an LED display on a flexible substrate. Further, such a glass substrate process requires expensive equipment such as an exposure device, a resist application and development device, a dry etching device, a sputtering device, a cleaning device, there is no choice but to produce an LED display at high costs.

Second, since it is not until the display is completed that electricity can be passed through the LED chips, it is not until the display is completed that imperfections in pixels due to defects or the like of the LED chips can be found. Further, since the LED chips are incorporated in a surface of the glass substrate, it is very difficult to do repairs once the display is completed. This results in low yield rates and high repair costs, which could be factors for cost increases.

Third, since only simple matrix driving is possible, an increase in screen size poses problems such as a delay in display due to a signal delay.

The present invention has been made to solve such problems, and it is an object of the present invention to provide a technology for manufacturing, at a high yield rate, a high image quality supersized image display device that can be produced on a flexible substrate.

Solution to Problem

An image display device according to an aspect of the present invention is an image display device formed by two-dimensionally arraying a plurality of pixel sections, including: a base substrate; and a plurality of pixel substrates. The plurality of pixel substrates are arranged over the base substrate, and each of the plurality of pixel substrates constitutes at least one of the pixel sections. The base substrate includes a first substrate having a first principal surface and a second principal surface located on a side opposite to the first principal surface, and a first wiring member placed over the first or second principal surface. Each of the pixel substrates includes a second substrate having a third principal surface and a fourth principal surface located on a side opposite to the third principal surface, a plurality of light-emitting elements mounted over the third principal surface, a driving circuit, mounted over the third principal surface, for driving the plurality of light-emitting elements, an external connection terminal, formed over the third principal surface, through which to receive an input signal that is supplied from outside the pixel substrate, and a second wiring member, placed on the third or fourth principal surface, which is electrically connected to the plurality of light-emitting elements, the driving circuit, and the external connection terminal. The second substrate is disposed to be stacked on top of the first substrate so that the first principal surface and the fourth principal surface face each other, and the second wiring member is electrically connected to the first wiring member.

Preferably, in the pixel substrates, an inspection as to whether emission characteristics of the light-emitting elements are normal is performed for each of the pixel sections, and that one or those ones of the pixel sections any one of whose light-emitting elements is not normal in the emission characteristics is or are repaired.

Preferably, the plurality of light-emitting elements include a red light-emitting element, a green light-emitting element, and a blue light-emitting element. The red light-emitting element, the green light-emitting element, and the blue light-emitting element are each constituted by a compound semiconductor light-emitting element or a combination of a compound semiconductor light-emitting element and a wavelength-conversion layer.

Preferably, the driving circuit include a transistor formed on a single-crystal silicon substrate.

Preferably, the first substrate is a film substrate having flexibility.

Advantageous Effects of Invention

An aspect of the present invention makes it possible to provide a technology for manufacturing, at a high yield rate, a high image quality supersized image display device that can be produced on a flexible substrate.

BRIEF DESCRIPTION OF DRAWINGS

FIG. 7 illustrates a cross-sectional view (FIG. 7(1)) taken along segment A-A shown in FIG. 6 and a cross-sectional view (FIG. 7(2)) taken along segment B-B shown in FIG. 6.

FIG. 11 illustrates a cross-sectional view (FIG. 11(1)) taken along segment A-A shown in FIGS. 6 and 8 with the pixel substrate disposed over the base substrate and a cross-sectional view (FIG. 11(2)) taken along segment B-B shown in FIGS. 6 and 8.

FIG. 12 is a schematic view for explaining an operation of removing defective pixel sections.

DESCRIPTION OF EMBODIMENTS

Figure 1:
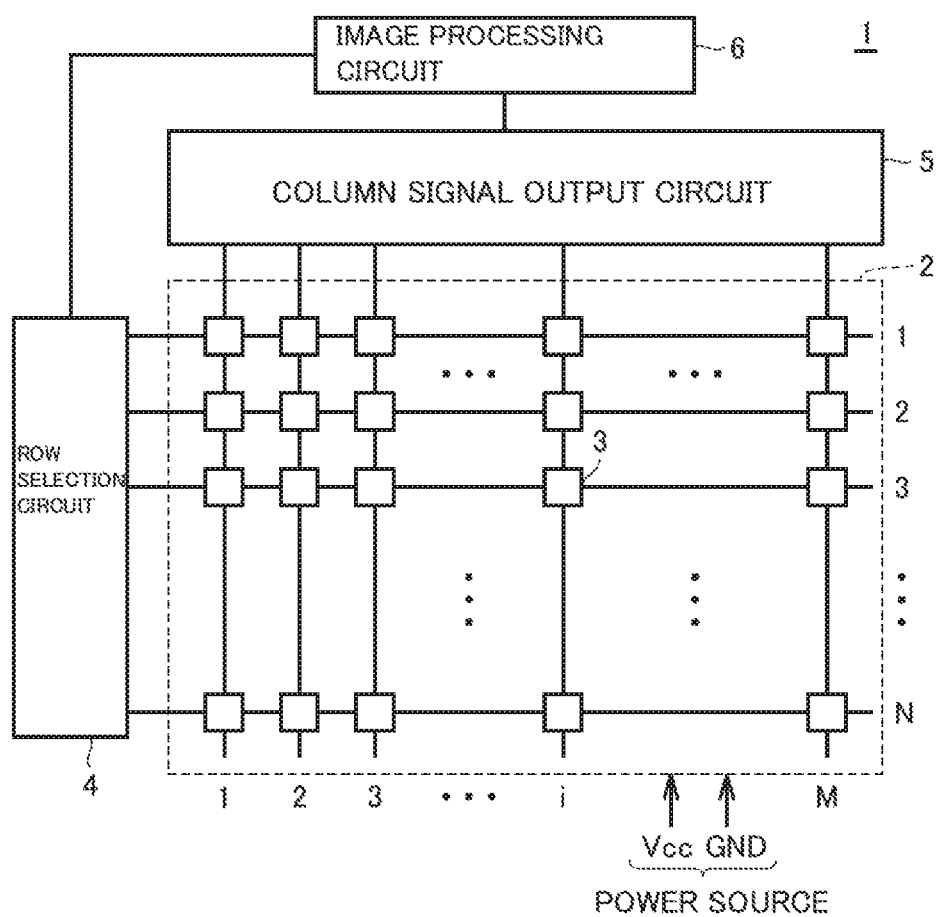
FIG. 1 is a diagram showing an overall configuration of an image display device according to a first embodiment of the present invention.

The following describes an aspect of the present invention with reference to the drawings. It should be noted that, in the drawings of an aspect of the present invention, the same reference signs denote identical or equivalent components. Further, dimensional relationships such as those between lengths, widths, layer thicknesses, and depths are subject to appropriate change for clarification and simplification of the drawings and, as such, do not represent actual dimensional relationships.

First Embodiment (Configuration of Image Display Device)

FIG. 1 is a diagram showing an overall configuration of an image display device according to a first embodiment of the present invention.

As shown in FIG. 1, the image display device (display) 1 includes a pixel array section 2 and a group of devices for driving the pixel array section 2. The group of devices include a row selection circuit 4, a column signal output circuit 5, and an image processing circuit 6.

The pixel array section 2 includes a plurality of pixel sections 3 arrayed in an matrix of N rows and M columns (where N and M are an integer of 1 or greater). For example, in a case where the display 1 is an image display device of the full high-definition standard, the number of pixels is approximately two million, as M=1920 and N=1080. In the following description, the pixel section 3 in the jth row (where j is an integer of 1 to N) and the ith column (where i is an integer of 1 to M) is also referred to as "pixel section 3(i, j)".

The row selection circuit 4 selects a row of the pixel array section 2. The column signal output circuit 5 outputs image data to each of the pixel sections 3 connected to the row thus selected.

The image processing circuit 6 controls the row selection circuit 4 and the column signal output circuit 5 so that the pixel array section 2 forms a desired image. The pixel array section 2 is supplied with voltages (i.e. a power voltage Vcc and a ground voltage GND) for driving the pixel sections 3.

(Configuration of Pixel Section)

Figure 2:
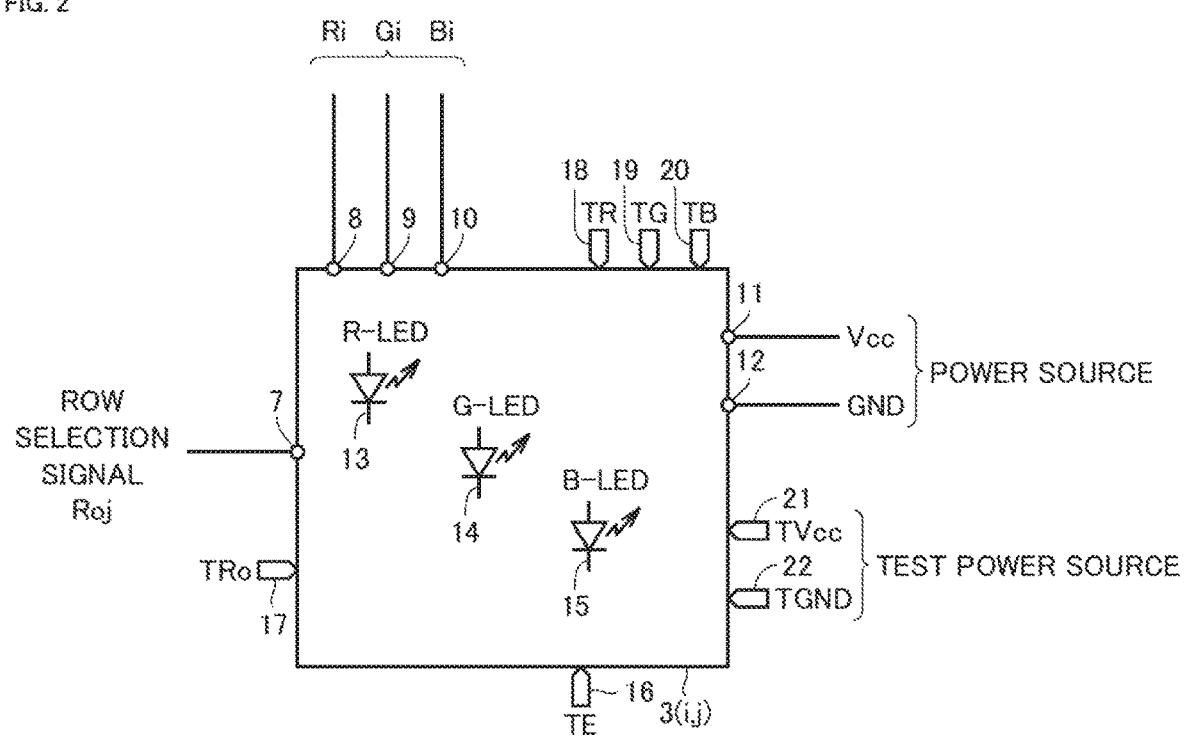
FIG. 2 is a diagram schematically showing a configuration of a pixel section of a pixel array section.

FIG. 2 is a diagram schematically showing a configuration of a pixel section 3 of the pixel array section 2.

As shown in FIG. 2, the pixel section 3(i, j) includes a plurality of light-emitting elements 13 to 15, a plurality of input terminals 7 to 12, and a driver IC 90. Although FIG. 2 presupposes three light-emitting elements, namely red, green, and blue light-emitting elements, it is alternatively possible to use three or more light-emitting elements. For example, it is possible to add a white or yellow light-emitting element as a fourth light-emitting element. It should be noted that, as for a circuit that drives these light-emitting elements, it is possible to apply a variety of circuit configurations that are available as publicly-known technologies. Such circuit configurations include circuit configurations that require more driving signals.

As the plurality of light-emitting elements, light-emitting elements that are normally employed in this field can be used without any particular limitation. Examples of such light-emitting elements include semiconductor light-emitting elements such as InGaAlP compound semiconductor LED chips, AlGaAs compound semiconductor LED chips, InGaN compound semiconductor LED chips, and II-VI group compound semiconductor LED chips. In the present embodiment, the light-emitting elements are LED chips 13 to 15 of the three primary colors, namely red (InGaAlP), green (InGaN), and blue (InGaN), respectively.

It should be noted that an InGaAlP compound semiconductor LED chip is an LED chip whose light-emitting layer is an InGaAlP layer. An AlGaAs compound semiconductor LED chip is an LED chip whose light-emitting layer is an AlGaAs layer. An InGaN compound semiconductor LED chip is an LED chip whose light-emitting layer is an InGaN layer. Further, a II-VI group compound semiconductor LED chip is an LED chip whose light-emitting layer is a II-VI group semiconductor layer such as a ZnO layer.

A common InGaN compound semiconductor LED chip is configured to include a gallium nitride compound semiconductor grown on a heterogeneous substrate such as a sapphire substrate, a ZnO substrate, a Si substrate, a SiC substrate, or a heterogeneous substrate such as a spinel substrate. It is possible to form an InGaN compound semiconductor LED chip on a homogeneous substrate such as a GaN single-crystal substrate. However, at present, a GaN substrate is expensive. This incurs high costs.

It is possible to produce the three primary colors of light, namely red, green, and blue light, by directly using the self-luminosity of LED elements as mentioned above. Alternatively, it is also possible to do so by converting ultraviolet radiation, near-ultraviolet radiation such as blue-violet light, blue light, or the like emitted by an LED element into red light or green light through a wavelength conversion material such as a phosphor. Similarly, it is also possible to do so by converting ultraviolet radiation or near-ultraviolet radiation emitted by an LED element into blue light.

The pixel section 3(i, j) receives through the input terminal 7 a row selection signal Roj for selecting the jth row and receives through the input terminals 8 to 10 column data signals Ri, Gi, and Bi consisting of three signals of red (R), green (G), and blue (B), respectively. It should be noted that, in FIG. 1, the three column data signal Ri, Gi, and Bi are collectively expressed as one signal. The pixel section 3(i, j) further receives the power voltage Vcc and the ground voltage GND through the input terminals 11 and 12, respectively. These signals and power sources are used during an actual operation in which the pixel section 3(i, j) actually functions as a part of an image display element. It should be noted that in a case where the number of light-emitting elements is large or in a case where the number of driving signals is large, the number of input signals increases in accordance with the number of light-emitting elements or the number of driving signals.

Activation of the row selection signal Roj in the pixel section 3(i, j) causes the red LED chip (R-LED) 13, the green LED chip (G-LED) 14, and the blue LED chip (B-LED) 15 to emit light for a predetermined period of time at intensities corresponding to the column data signals Ri, Gi, and Bi, respectively.

The pixel section 3(i, j) further includes external connection terminals (test pads) 16 to 22 through which to receive input signals that are supplied from outside the pixel section. These input signals include test signals for inspecting the emission characteristics of the pixel section 3(i, j).

Specifically, the test signals include a test mode selection signal TE for selecting a test mode in which to carry out an inspection on the pixel section 3(i, j), a test row selection signal TRo that selects a row of the pixel array section 2 during the test mode, test column data signals TR, TG, and TB representing image data during the test mode, and voltages (i.e. a test power voltage TVcc and a test ground voltage TGND) that are supplied to the pixel section 3(i, j) during the test mode. As mentioned above, in a case where the number of light-emitting elements that constitute the pixel section 3 exceeds 3 or in a case where more driving signals are required, the number of external connection terminals increases in accordance with the configuration of the pixel section 3. At least the external connection terminals 17 to 20 are not connected to anywhere in a case where they are packaged in the pixel array section 2. It is preferable that the external connection terminal 16 (which corresponds to the test mode selection signal TE) be connected to the GND line or the VCC line in a case where it is packaged in the pixel array section 2, as the test mode is completely turned off during normal operation.

An activated test mode selection signal TE inputted to the external connection terminal 16 causes the pixel section 3(i, j) to be set into the test mode. In the test mode, the pixel section 3(i, j) receives the test row selection signal TRo through the external connection terminal 17, receives the test column data signals TR, TG, and TB through the external connection terminals 18 to 20, and receives the test power voltage TVcc and the test ground voltage TGND through the external connection terminals 21 and 22, respectively.

The pixel section 3(i, j) is provided with the driver IC 90 for driving the LED chips 13 to 15. During normal operation, the driver IC 90 drives the LED chips 13 to 15 in accordance with the row selection signal Roj and the column data signals Ri, Gi, and Bi that are inputted to the input terminals 7 to 10. Further, during the test mode, the driver IC 90 drives the LED chips 13 to 15 in accordance with the test row selection signal TRo and the test column data signals TR, TG, and TB that are inputted to the external connection terminals 17 to 20.

The driver IC 90 has both a function of driving the light-emitting elements on the basis of signals that the pixel section 3(i, j) receives from an outside source in a case where it operates as a product and a function of testing the operating performance of the pixel section 3(i, j) on the basis of those signals at a manufacturing stage. The testing function includes a function of selecting actuating signals such as the row selection signal and the column data signals and the corresponding test signals TRo, TR, TG, and TB according to the test mode selection signal TE.

Figure 3:
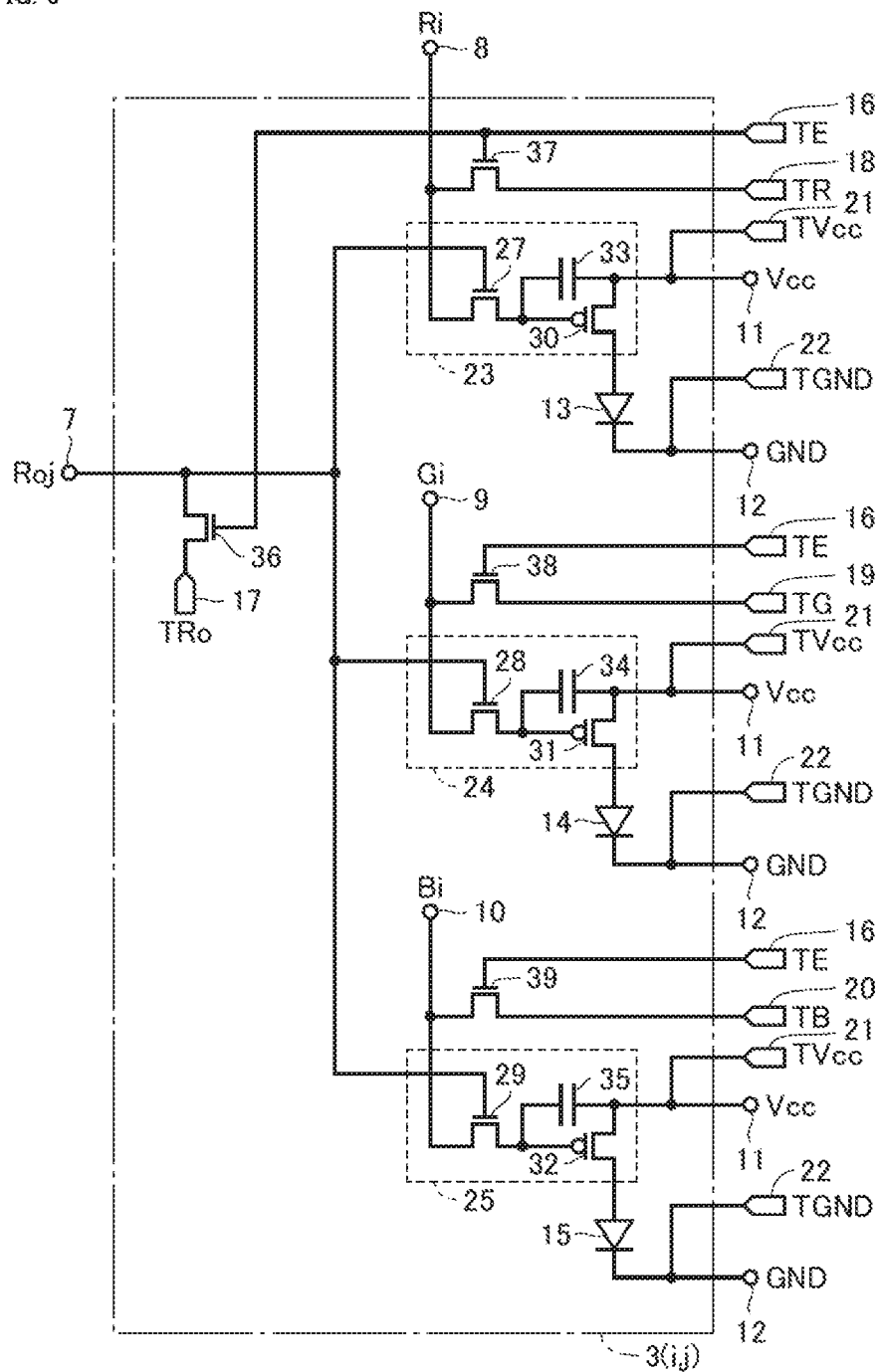
FIG. 3 is a diagram showing an example of a circuit configuration of the pixel section.

FIG. 3 is a diagram showing an example of a circuit configuration of the pixel section 3(i, j).

As shown in FIG. 3, the pixel section 3(i, j) includes driving sections 23 to 25 that drive the LED chips 13 to 15, respectively, and test transistors 36 to 39. Both the driving sections 23 to 25 and the test transistors 36 to 39 are built in the driver IC 90. As shown in FIG. 3, the driver IC 90 includes most of the constituent elements of the pixel section 3(i, j), excluding the light-emitting elements, the test pads, and wires connecting them. It should be noted that although, in the example shown in FIG. 3, the input terminals 9 and 10 are included in the driver IC 90 for illustrative purposes, the driver IC 90 is not supposed to include the input terminals 9 and 10.

The driver IC 90 is excellent in characteristic and cost when it is manufactured by a bulk CMOS process of forming a bulk MOS transistor on a single-crystal silicon substrate. Note, however, that as long as it fulfills functions which are equivalent to those of the circuit shown in FIG. 3, it may be manufactured by a CMOS process on an SOI (silicon on insulator) substrate, a bipolar process on a silicon substrate, a process of forming a thin-film transistor on an insulating substrate such as a glass substrate, or a process of forming an FET (field-effect transistor) on a compound semiconductor substrate such as a GaN substrate or a GaAs substrate.

The driving section 23, which drives the red LED chip 13, includes a selection transistor 27, a driving transistor 30, and a storage capacitor 33. The driving section 24, which drives the green LED chip 14, includes a selection transistor 28, a driving transistor 31, and a storage capacitor 34. The driving section 25, which drives the blue LED chip 15, includes a selection transistor 29, a driving transistor 32, and a storage capacitor 35.

The selection transistors 27 to 29 are constituted by N-channel MOS transistors (hereinafter referred to as "NMOS transistors"). The driving transistors 30 to 32 are constituted by P-channel MOS transistors (hereinafter referred to as "PMOS transistors"). The test transistors 36 to 39 are constituted by NMOS transistors.

In the driving section 23, the selection transistor 27 has its gate connected to the input terminal 7, its drain connected to the input terminal 8, and its source connected to the gate of the driving transistor 30. The driving transistor 30 has its source connected to the input terminal 11 and the external connection terminal 21 and its drain connected to the anode of the red LED chip 13. The red LED chip 13 has its cathode connected to the input terminal 12 and the external connection terminal 22. The storage capacitor 33 is connected between the gate and source of the driving transistor 30.

In the driving section 24, the selection transistor 28 has its gate connected to the input terminal 7, its drain connected to the input terminal 9, and its source connected to the gate of the driving transistor 31. The driving transistor 31 has its source connected to the input terminal 11 and the external connection terminal 21 and its drain connected to the anode of the green LED chip 14. The green LED chip 14 has its cathode connected to the input terminal 12 and the external connection terminal 22. The storage capacitor 34 is connected between the gate and source of the driving transistor 31.

In the driving section 25, the selection transistor 29 has its gate connected to the input terminal 7, its drain connected to the input terminal 10, and its source connected to the gate of the driving transistor 32. The driving transistor 32 has its source connected to the input terminal 11 and the external connection terminal 21 and its drain connected to the anode of the blue LED chip 15. The blue LED chip 15 has its cathode connected to the input terminal 12 and the external connection terminal 22. The storage capacitor 35 is connected between the gate and source of the driving transistor 32.

The test transistor 37 has its gate connected to the external connection terminal 16, its drain connected to the input terminal 8, and its source connected to the external connection terminal 18. The test transistor 38 has its gate connected to the external connection terminal 16, its drain connected to the input terminal 9, and its source connected to the external connection terminal 19. The test transistor 39 has its gate connected to the external connection terminal 16, its drain connected to the input terminal 10, and its source connected to the external connection terminal 20. The test transistor 36 has its gate connected to the external connection terminal 16, its drain connected to the input terminal 7, and its source connected to the external connection terminal 17.

In the foregoing configuration, when, during normal operation, the row selection circuit 4 (see FIG. 1) activates the row selection signal Roj to an H (logic high) level, the selection transistors 27, 28, and 29 become turned on, so that the column data signals Ri, Gi, and Bi are inputted to the gates of the driving transistors 30, 31, and 32, respectively.

In the driving section 23, when the driving transistor 30 becomes turned on in accordance with the column data signal Ri, an electric current corresponding to the column data signal Ri flows through the red LED chip 13. This causes the red LED chip 13 to emit red light at an intensity corresponding to the column data signal Ri. It should be noted that since the gate potential of the driving transistor 30 is retained by the storage capacitor 33 even after the period of selection of the jth row has ended and the row selection signal Roj has switched to an L (logic low) level, the electric current continues to flow through the red LED 13.

In the driving section 24, as in the driving section 23, when the driving transistor 31 becomes turned on in accordance with the column data signal Gi, an electric current corresponding to the column data signal Gi flows through the green LED chip 14, whereby the green LED chip 14 emits green light at an intensity corresponding to the column data signal Gi.

In the driving section 25, as in the driving sections 23 and 24, when the driving transistor 32 becomes turned on in accordance with the column data signal Bi, an electric current corresponding to the column data signal Bi flows through the blue LED chip 15, whereby the blue LED chip 15 emits blue light at an intensity corresponding to the column data signal Bi.

Next, the operation of the pixel section 3($i, j$) in the test mode is described. When the test mode selection signal TE is activated to an H level, the test transistors 36, 37, 38, and 39 become turned on, whereby the pixel section 3($i, j$) is set into the test mode. During the test mode, the external connection terminals 17 to 20 become effective instead of the input terminals 7 to 10. The driving sections 23 to 25 drive the LED chips 13 to 15, respectively, in accordance with the test row selection signal TRo and the test column data signals TR, TG, and TB that are inputted to the external connection terminals 17 to 20.

Specifically, in the driving section 23, the selection transistor 27 receives the test row selection signal TRo from the external connection terminal 17 through the gate and receives the test column data signal TR from the external connection terminal 18 through the drain. When the test row selection signal TRo is activated to an H level, the selection transistor 27 becomes turned on, so that the test column data signal TR is inputted to the gate of the driving transistor 30. When the driving transistor 30 becomes turned on in accordance with the test column data signal TR, the anode of the red LED chip 13 is supplied with the test power voltage TVcc from the external connection terminal 21. The flow of an electric current through the red LED chip 13 causes the red LED chip 13 to emit red light at an intensity corresponding to the test column data signal TR.

In the driving section 24, the selection transistor 28 receives the test row selection signal TRo from the external connection terminal 17 through the gate and receives the test column data signal TG from the external connection terminal 19 through the drain. When the test row selection signal TRo is activated to an H level, the selection transistor 28 becomes turned on, so that the test column data signal TG is inputted to the gate of the driving transistor 31. When the driving transistor 31 becomes turned on in accordance with the test column data signal TG, the anode of the green LED chip 14 is supplied with the test power voltage TVcc from the external connection terminal 21. The flow of an electric current through the green LED chip 14 causes the green LED chip 14 to emit green light at an intensity corresponding to the test column data signal TG.

In the driving section 25, the selection transistor 29 receives the test row selection signal TRo from the external connection terminal 17 through the gate and receives the test column data signal TB from the external connection terminal 20 through the drain. When the test row selection signal TRo is activated to an H level, the selection transistor 29 becomes turned on, so that the test column data signal TB is inputted to the gate of the driving transistor 32. When the driving transistor 32 becomes turned on in accordance with the test column data signal TB, the anode of the blue LED chip 15 is supplied with the test power voltage TVcc from the external connection terminal 21. The flow of an electric current through the blue LED chip 15 causes the blue LED chip 15 to emit blue light at an intensity corresponding to the test column data signal TB.

Since the external connection terminals 16 and 22 are made effective by thus setting the pixel section 3 into the test mode, the LED chips 13 to 15 of the pixel section 3 can be driven by using the test signals (TE, TRo, TR, TG, TB, TVcc, and TGND) that are inputted to the external connection terminals 16 to 22. This makes it possible to inspect the emission characteristics of the LED chips 13 to 15 for each pixel section 3. This inspection is carried out for each pixel substrate mounted with a plurality of pixel sections 3. The step of inspecting a pixel substrate will be described later.

(Method for Manufacturing Image Display Device)

Next, a method for manufacturing an image display device according to the first embodiment is described. The following specifically describes the manufacturing method by taking, as an example, a method for manufacturing a display 1 including a pixel array section 2 composed of 640×480 effective pixels (that comply with the VGA (video graphics array) standard) each having a pixel size of 1.0 mm×1.0 mm.

Figure 4:
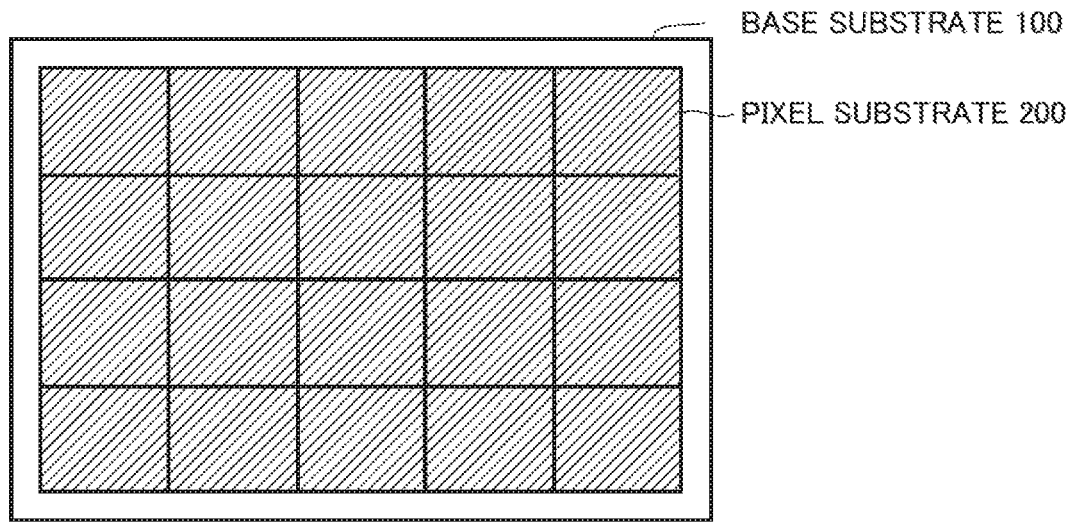
FIG. 4 is a plan view schematically showing a pixel array section of the display shown in FIG. 1.

FIG. 4 is a plan view schematically showing the pixel array section 2 of the display 1 shown in FIG. 1. As shown in FIG. 4, the pixel array section 2 includes a base substrate 100 and a plurality of pixel substrates 200 arranged over the base substrate 100.

Each of the pixel substrates 200 is mounted with at least one pixel section 3 (not illustrated). In the example shown in FIG. 4, each of the pixel substrates 200 has an effective part with a size of 125 mm×135 mm and is mounted with 125×135=16.9 thousand pixel sections 3. As shown in FIG. 4, a VGA-compliant display can be manufactured by arranging a total of twenty pixel substrates 200 in four rows along a vertical direction (i.e. a longitudinal direction of the drawing) and five columns along a horizontal direction (i.e. a transverse direction of the drawing).

Figure 5:
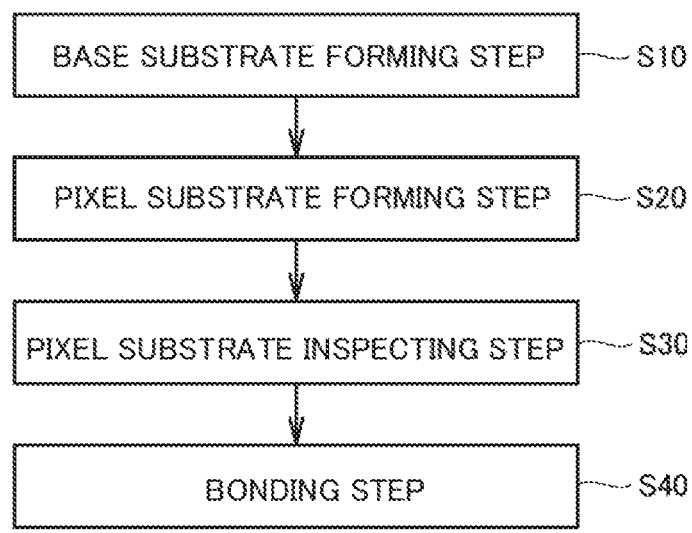
FIG. 5 is a flow chart explaining a method for manufacturing an image display device according to the first embodiment.

FIG. 5 is a flow chart explaining a method for manufacturing an image display device according to the first embodiment.

As shown in FIG. 5, the method for manufacturing an image display device according to the first embodiment includes a base substrate forming step (S10), a pixel substrate forming step (S20), a pixel substrate inspecting step (S30), and a bonding step (S40). Note, however, that the base substrate forming step (S10) needs only be executed before the bonding step (S40) and, for example, may be executed in parallel with, before, or after the pixel substrate forming step (S20) and the pixel substrate inspecting step (S30). The following describes each of the steps in detail.

(1) Base Substrate Forming Step (S10)

Figure 6:
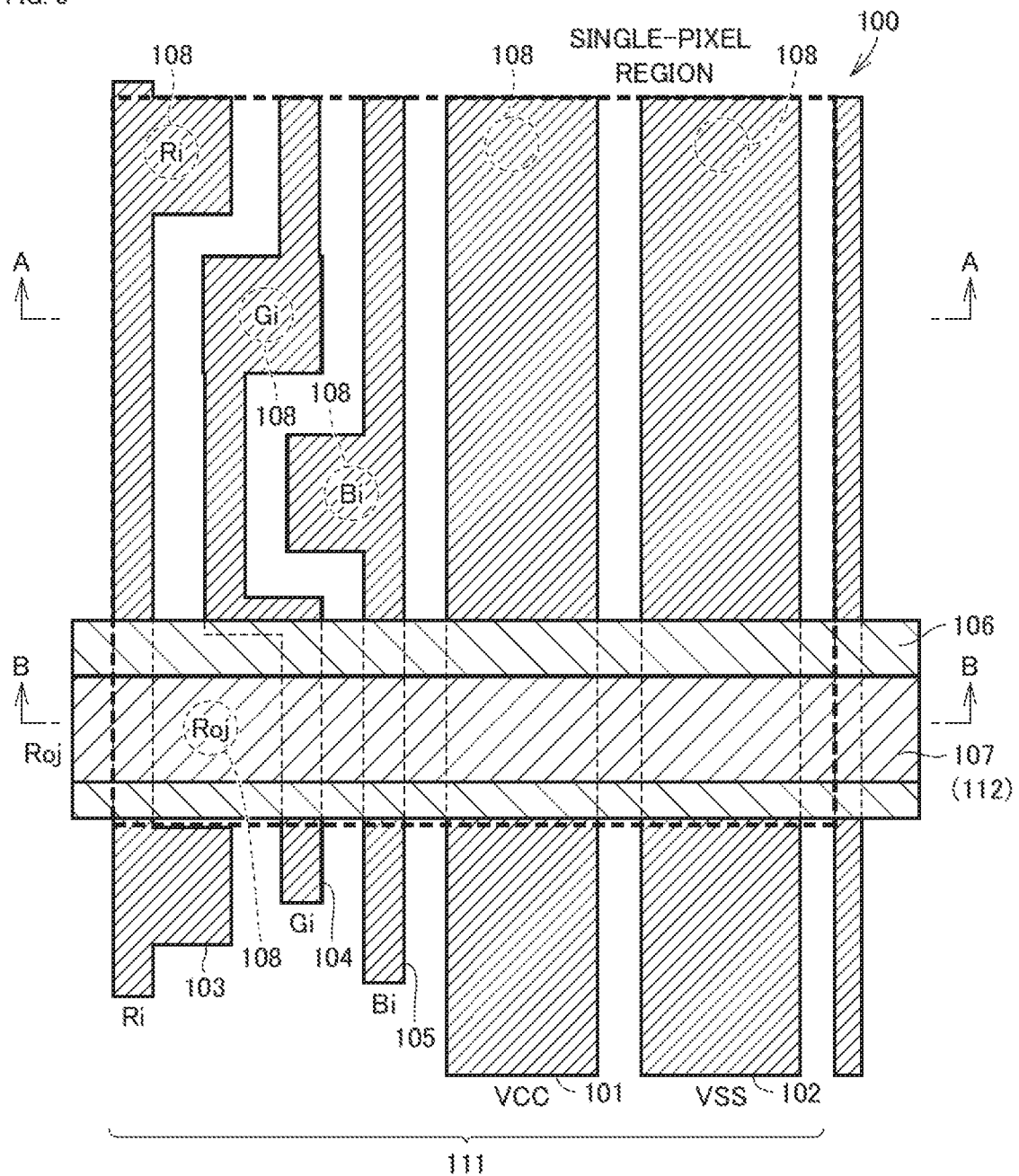
FIG. 6 is a plan view schematically showing a base substrate.

In the base substrate forming step (S10 of FIG. 5), a base substrate 100 is formed. FIG. 6 is a plan view schematically showing a base substrate 100. FIG. 6 partially shows a region of a principal surface of the base substrate 100 that constitutes a single pixel. FIG. 7(1) is a cross-sectional view taken along segment A-A shown in FIG. 6, and FIG. 7(2) is a cross-sectional view taken along segment B-B shown in FIG. 6.

As shown in FIGS. 6 and 7, the base substrate 100 includes a film substrate 110 and wiring layers 111 and 112 (first wiring member) placed over the film substrate 110.

The film substrate 110 is constituted by a member having flexibility and, preferably, is made of polyimide resin or the like. The film substrate 110 has a first principal surface 110a and a second principal surface 110b located on a side opposite to the first principal surface 110a. The second principal surface 110b constitutes the back side of the pixel array section 2. Although the present invention is applicable even if the base substrate is made of a substrate material such as a hard glass substrate, the use of a film substrate having flexibility makes it possible to make the resulting display light in weight and able to be rolled up into a circular cylindrical shape for transportation. This makes transportation easier for a larger screen, thus advantageously making it possible to attain a wide range of applications.

The first wiring layer 111 is formed on the first principal surface 110a of the film substrate 110. The second wiring layer 112 is formed on an upper side of the first wiring layer 111 in a thickness direction of the film substrate 110. As shown in FIG. 6, the second wiring layer 112 and the first wiring layer 111 are disposed to partially overlap each other in a plan view.

Provided between the first wiring layer 111 and the second wiring layer 112 is an interlayer insulating film 106. This ensures electrical insulation between the first wiring layer 111 and the second wiring layer 112.

The first wiring layer 111 includes a power line 101 through which the power voltage VCC is supplied, an earth line 102 through which the ground voltage VSS is supplied, and column data signal lines 103 to 105 through which the column data signal lines Ri, Gi, and Bi are transmitted, respectively. The second wiring layer 112 includes a row selection signal line 107 through which the row selection signal Roj is transmitted.

The wiring layers 111 and 112 are provided with terminal areas 108 through which to make an electrical connection with a pixel substrate 200. In the after-mentioned bonding step (S40 of FIG. 5), the wiring layers 111 and 112 are electrically connected through these terminal areas 108 to wiring patterns (second wiring member) of the pixel substrate 200.

In the base substrate forming step (S10), first, the film substrate 110 is prepared. The film substrate 110 is made of a polyimide film measuring 800 mm in length, 600 mm in width, and 100 μm in thickness. On the first principal surface 110a of the film substrate 110, the first wiring layer 111 composed of a plurality of wiring patterns as shown in FIG. 6 is formed.

Specifically, first, a conductive member such as copper foil is pasted to the first principal surface 110a of the film substrate 110. Next, a resist pattern is formed by performing a common photolithographic step on the film substrate 110. A part of the conductive member is etched with the resist pattern as a mask, whereby the wiring patterns are formed.

Next, the interlayer insulator film 106 is formed to cover some regions of the first wiring layer 111. The regions are set to include regions that are covered by the second wiring layer 112. Gel silicon resin is applied to the regions by an inkjet method and then fired, whereby the interlayer insulating film 106 is formed.

Then, the second wiring layer 112 is formed by applying copper nanoparticles onto the interlayer insulating film 106 with a common inkjet method.

After the first wiring layer 111 and the second wiring layer 112 have been formed, the wiring patterns are evaluated for the presence or absence of an electrical short circuit in the wiring patterns, the magnitude of interconnection resistance, and the like by passing electricity through the wiring patterns thus formed. If detected with an abnormality such as an electrical short circuit, an abnormally high interconnection resistance, or the like as a result of this evaluation, the base substrate 100 is discarded after the evaluation.

The base substrate 100 may be formed by a variety of methods and materials other than the aforementioned method or combination. For example, the first wiring layer 111 may be formed by an inkjet method. Further, the second wiring layer 112 may be formed by a photolithographic technique. Aluminum may be used as wiring material instead of copper. The wiring material does not need to be a simple substance, but for example, a gold-plated layer may be formed on a surface of copper. The interlayer insulating film 106 may be formed by forming an interlayer insulating film all over the film substrate 110, forming the second wiring layer 112, and then boring through the interlayer insulating film of the terminal areas 108 on the wires 101 to 105 with a photolithographic technique. Alternatively, the interlayer insulating film 106 may be formed by forming the second wiring layer 112, forming another interlayer insulating layer, and boring through the interlayer insulating film located at the terminal areas 108 with a photolithographic technique. It should be noted that the number and disposition of wires can be changed according to the scheme under which the pixel sections 3 are driven, the number of light-emitting elements of the pixel sections 3, and the like.

The important point is that the group of wires (i.e. the signal lines 101 to 105 and 107) connecting the group of devices (such as the row selection circuit 4, the column signal output circuit 5, and the image processing circuit 6) for driving the pixel array section 2 of the image display device (display) 1 with the pixel sections 3 are directly formed in a surface of the base substrate 100. It should be noted it is preferable that the group of wires be tested for removal of defects.

(2) Pixel Substrate Forming Step (S20)

Figure 8:
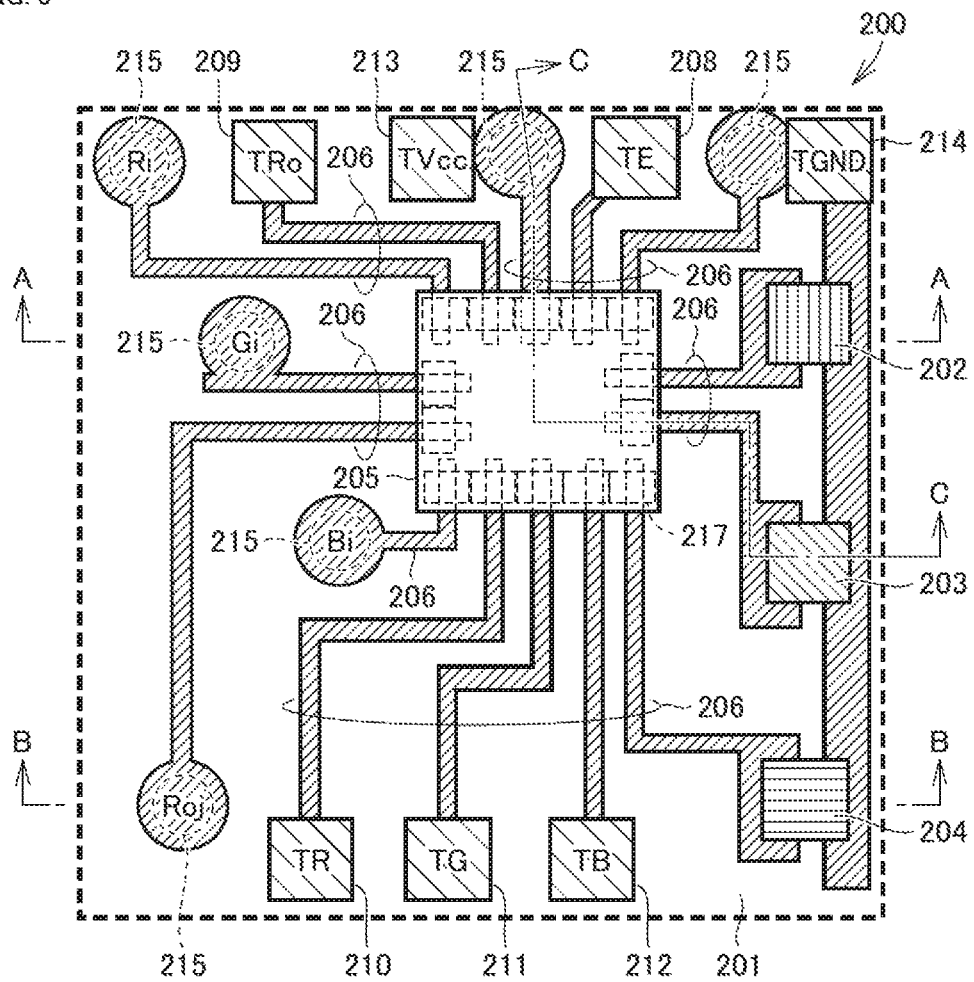
FIG. 8 is a plan view schematically showing a pixel substrate.
Figure 9:
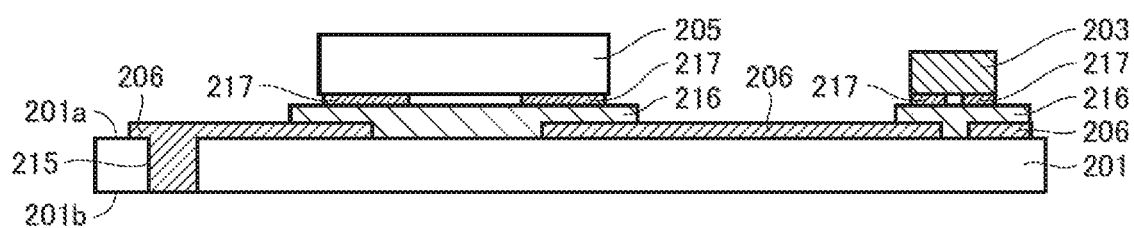
FIG. 9 is a cross-sectional view taken along segment C-C shown in FIG. 8.

In the pixel substrate forming step (S20 of FIG. 5), pixel substrates 200 are formed. FIG. 8 is a plan view schematically showing a pixel substrate 200. FIG. 8 partially shows a region of a principal surface of the pixel substrate 200 that constitutes a single pixel. The single-pixel region of the pixel substrate 200 shown in FIG. 8 is a region that overlaps the single-pixel region of the base substrate 100 shown in FIG. 6 in a plan view of a state (see FIG. 4) where the pixel substrates 200 are disposed over the base substrate 100. FIG. 9 is a cross-sectional view taken along segment C-C shown in FIG. 8.

As shown in FIGS. 8 and 9, the pixel substrate 200 includes a film substrate 201, wiring patterns 206 (second wiring member), LED chips 202 to 204, a driver IC 205, and external connection pads 208 to 214.

The film substrate 201 is constituted by a member having flexibility and, preferably, is made of polyimide resin or the like. The film substrate 201 has a third principal surface 201a and a fourth principal surface 201b located on a side opposite to the third principal surface 201a. The third principal surface 201a constitutes the front side of the pixel array section 2. Although the present invention is applicable even if the pixel substrate is made of a substrate material such as a hard glass substrate, the use of a film substrate having flexibility makes it easier to make the resulting display to be flexible and light in weight. This makes transportation easier for a larger screen, thus advantageously making it possible to attain a wide range of applications.

The plurality of wiring patterns 206 are formed on the third principal surface 201a of the film substrate 201. The plurality of external connection pads 208 to 214 are further formed over the third principal surface 201a. The external connection pads 208 to 214 serve to realize the external connection terminals 16 to 22 shown in FIG. 2. Specifically, the external connection pad 208 constitutes the external connection terminal 16 through which to receive the test mode selection signal TE, and the external connection pad 209 constitutes the external connection terminal 17 through which to receive the test row selection signal TRo. The external connection pads 210 to 212 constitute the external connection terminals 18 to 20 through which to receive the test column data signals TR, TG, and TB, respectively. The external connection pads 213 and 214 constitute the external connection terminals 21 and 22 through which to receive the test power voltage TVcc and the test ground voltage TGND, respectively.

The red LED chip 202 corresponds to an example of the red LED chip 13 shown in FIG. 2. The green LED chip 203 corresponds to an example of the green LED chip 14 shown in FIG. 2. The blue LED chip 204 corresponds to an example of the blue LED chip 15 shown in FIG. 2. The driver IC 205 corresponds to an example of the driver IC 90 shown in FIG. 3.

The LED chips 202 to 204 and the driver IC 205 are mounted over the third principal surface 201a of the film substrate 201. The driver IC 205 are electrically connected to the LED chips 202 to 204 and the external connection pads 208 to 214 via the wiring patterns 206, respectively. The driver IC 205 measures 310 μm×280 μm, and each of the LED chips 202 to 204 measures 100 μm per side.

As shown in FIG. 9, the green LED chip 203 is connected to the wiring patterns 206 by flip-chip bonding via an anisotropic conductive adhesive (ACF: asymmetric conductive film) 216 with its surface electrode pad facing the third principal surface 201a. The LED chip and the electrode pad may alternatively be joined together by another joining method such as conductive paste or solder joining.

Figure 10:
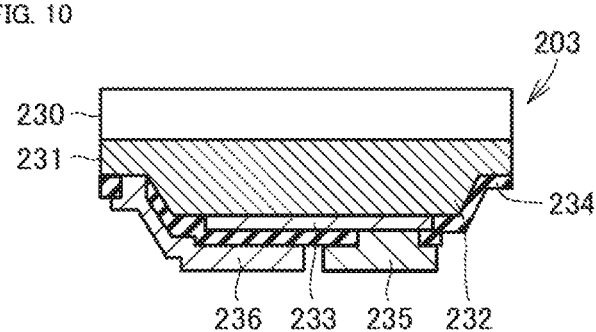
FIG. 10 is a cross-sectional view of a green LED chip.

FIG. 10 is a cross-sectional view of the green LED chip 203. As shown in FIG. 10, the green LED chip 203 is for example a nitride semiconductor LED chip. The green LED chip 203 includes a substrate 230, a nitride semiconductor epitaxial layer (epitaxially-grown layer) 231, a transparent electrode 233, a transparent protective film 234, a p-side electrode 235, and an n-side electrode 236.

Unless otherwise specified below, the nitride semiconductor LED chip may be configured or manufactured by using conventional publicly-known technologies. That is, in the present embodiment, the structure, material, composition, method of formation, condition of formation, thickness, and the like of the green LED chip 203 are not particularly limited but may be based on a proper combination of conventional publicly-known technologies.

For example, the substrate 230 may be an insulative substrate such as a sapphire substrate or may be a conductive substrate such as a GaN substrate, a SiC substrate, or a ZnO substrate. The substrate 230 is ground to a thickness of approximately 20 to 100 μm.

The nitride semiconductor epitaxial layer 231 is constituted by a foundation layer, an n-type nitride semiconductor layer, an active layer (light-emitting layer), and a p-type nitride semiconductor layer (none of which is illustrated) being stacked on top of each other in this order from the substrate 230 side. The n-type nitride semiconductor layer includes an n-side contact layer to which the n-side electrode 236 is connected. The active layer has a quantum well structure. The active layer may be composed of a single quantum well structure or may be composed of a multiple quantum well structure in which a well layer and a barrier layer are alternately stacked on top of each other. The p-type nitride semiconductor layer is constituted by a p-type AlGaN layer, a p-type GaN layer, and a p-type contact layer being stacked on top of each other in this order from the substrate 230 side.

The semiconductor epitaxial layer 231 has an etched part constituting a mesa part 232. The transparent electrode 233 is provided on a surface of the semiconductor epitaxial layer 231 that faces the p-side nitride semiconductor layer. The transparent electrode 233 is a transparent conductive film such as an ITO (indium tin oxide) film or an IZO (indium zinc oxide) film.

The transparent protective film 234 covers side faces of the transparent electrode 233 and the mesa part 232. The transparent protective film 234 has an opening through which a surface of the n-type nitride semiconductor layer (n-type contact layer) that is exposed by etching is exposed and an opening through which a surface of the transparent electrode 233 is exposed. The n-side electrode 236 is provided on an exposed part of the n-type nitride semiconductor layer. The p-type electrode 235 is provided on an exposed part of the transparent electrode 233.

Although not illustrated, the blue LED chip 204 is a nitride semiconductor LED chip like the green LED chip 203 and has the same shape as the green LED chip 203. On the other hand, the red LED chip 202 is an InGaAlP compound semiconductor LED chip. The red LED chip 202 has the same shape as the green LED chip 203.

The blue LED chip 204, the green LED chip 203, and the red LED chip 202 had the following emission characteristics (peak wavelengths and light outputs) at room temperature. It should be noted that the medians of light outputs and output variations were calculated from the light outputs of a plurality of LED chips formed on the same substrate.

The blue LED chip 204 had a peak wavelength of 460±5 nm, a median of 1.2 μW of light outputs at an electric current of 1 μA, and an output variation of ±7%. Further, the operating voltage of the blue LED chip 204 was 3.0 V. The green LED chip 203 had a peak wavelength of 520±4 nm, a median of 0.83 μW of light outputs at an electric current of 1 μA, and an output variation of ±7%. Further, the operating voltage of the green LED chip 203 was 3.1 V. The red LED chip 202 had a peak wavelength of 630±5 nm, a median of 1.0 μW of light outputs at an electric current of 1 μA, and an output variation of ±7%. Further, the operating voltage of the red LED chip 202 was 2.5 V.

Note here that the operating voltage of the red LED chip 202 is as low as 2.5 V while the operating voltages of the blue LED chip 204 and the green LED chip 203 are approximately 3.0 to 3.1 V. In such a case where there is a difference in operating voltage among the LED chips 202 to 204, it is preferable that the driving transistors 30, 31, and 32 (see FIG. 3) inside the driver IC 205 be configured such that the dependence of a driving current on a source-drain voltage be as small as possible.

Further, at a place distant from a feed section that feeds the power voltage Vcc, there may occur a voltage drop due to interconnection resistance. For this reason, it is preferable that, in anticipation of a voltage drop, the power voltage Vcc be set with such a margin so as to be higher than the minimum operating voltage of an LED chip. In a case where the minimum operating voltage of an LED chip is approximately 3.0 V, the power voltage is set, for example, to 5.0 V or higher. It should be noted that since the magnitude of a voltage drop varies depending on wire length, it is preferable that the circuit configuration have a sufficient voltage margin.

In the present embodiment, each of the LED chips 202 to 204 has an electrode structure in which the p-side electrode and the n-side electrode are arranged on one surface. This allows the LED chips 202 to 204 to be flip-chip bonded to the wiring patterns 206, respectively, as shown in FIG. 9. This allows the wiring patterns 206 to be formed by a single wiring layer alone.

Specifically, for example, in a case where each of the LED chips 202 to 204 is configured such that the p-side electrode is disposed on one surface and the n-side electrode is disposed on the other surface, the connection of one of the electrodes to the wiring pattern 206 needs to be followed by the step of forming a separate wire for the other electrode. The step of forming a separate wire can be eliminated by electrically connecting the wiring pattern 206 to the other electrode by wire bonding. However, the addition of the wire bonding step invites an increase in the number of manufacturing steps and an increase in manufacturing cost. Further, since a wire bonding pad electrode and wire absorb output light from the LED chip, there may be a decrease in efficiency in the extraction of light from the LED chip. Furthermore, since performing wire boding requires the LED chip to be provided with a pad electrode measuring at least 60 to 70 μm in diameter, this makes it difficult to miniaturize the LED chip.

With continued reference to FIG. 9, the driver IC 205 is flip-chip bonded to the wiring patterns 206 via the anisotropic conductive adhesive 216. The driver IC 205 has, on a surface thereof, connection pads 217 through which to make an electrical connection with the wiring patterns 206. The driver IC 205 is electrically connected to the LED chips 202 to 204 via the connection pads 217, the anisotropic conductive adhesive 216, and the wiring patterns 206. The driver IC 205 is further electrically connected to the external connection pads 208 to 214 via the connection pads 217, the anisotropic conductive adhesive 216, and the wiring patterns 206. The driver IC 205 and the electrode pads may alternatively be joined together by another joining method such as conductive paste or solder joining.

The driver IC 205 is mounted with the driving sections 23 to 25 and the test transistors 36 to 39, which are shown in FIG. 3. As the PMOS transistors constituting the driving sections 23 to 25 and the NMOS transistors constituting the test transistors 36 to 39, transistors formed on a single-crystal silicon substrate are suitably used, respectively. The circuit configuration shown in FIG. 3, in which variations in threshold voltage of the driving transistors 30 to 32 easily cause variations in electric current flowing through the LED chips 13 to 15, may invite degradation in image quality. Composing the driving transistors 30 to 32 of single-crystal silicon devices makes it possible to reduce the occurrence of variations in threshold voltage. This makes it possible to prevent degradation in image quality.

The film substrate 201 have via holes 215 formed therein. The via holes 215 are filled with an electrical conducting material such as copper that has low electrical resistance and a small conductor loss. The via holes 215 constitute through conductors that pass through the film substrate 201. The via holes 215 are provided in such positions as to overlap the terminal areas 108 (see FIG. 6) of the base substrate 100 in a plan view of the pixel array section 2 (see FIG. 4). This allows the wiring layers 111 and 112 (first wiring member) in the surface of the base substrate 100 and the wiring patterns 206 (second wiring member) in the surface of the pixel substrate 200 to be electrically connected by the via holes 215 at the respective terminal areas 108 in the aftermentioned bonding step (S40 of FIG. 5).

In the pixel substrate forming step (S20 of FIG. 5), first, the film substrate 201 is prepared. The film substrate 201 is made of a polyimide film measuring 140 mm each side and 25 μm in thickness. The film substrate 201 is pasted to a glass substrate measuring 8 inches in diameter. A principal surface that faces the glass substrate corresponds to the fourth principal surface 201b.

Next, the wiring patterns 206 are formed on the third principal surface 201a of the film substrate 201. Specifically, a thin film made of an electrical conducting material such as copper with a thickness of approximately 5 μm is formed on the third principal surface 201a. In the formation of the thin film, as an example, thin conductive layers (i.e. an adhesive layer and a seed layer) are formed in advance by a sputtering method, and after a plating resist has been formed, wiring patterns are formed by electrolytic copper plating. After that, seed parts covered with the plating resist are removed by etching, whereby the wiring patterns 206 are completed. The wiring patterns 206 may alternatively be formed by forming a copper-plated layer all over the surface and then processing it into predetermined patterns through a common photolithographic step and a common wet etching step.

Next, the film substrate 201 on which the wiring patterns 206 have been formed is peeled from the glass substrate and pasted to another substrate, and the via holes 215 are formed in the film substrate 201. The through conductors are formed by filling the via holes 215 with an electrical conducting material. It should be noted that the wiring patterns 206 may alternatively be formed by forming the via holes 215 in the film substrate 201, pasting copper foil onto the principal surface 201a, filling the via holes 215 with an electrical conducting material (e.g. copper plating) from the principal surface 201a, and then processing the copper foil on the principal surface 201a.

Then, the LED chips 202 to 204 and the driver IC 205 are flip-chip bonded to the wiring patterns 206, respectively. Specifically, after the anisotropic conductive adhesive 216 has been placed on the surfaces of portions of the wiring patterns 206, the LED chips 202 to 204 and the driver IC 205 are placed over the anisotropic conductive adhesive 216 so that the electrodes and the wiring patterns 206 face each other, respectively. Heating and pressing the LED chips 202 to 204 and the driver IC 205 in this state causes the LED chips 202 to 204 and the driver IC 205 to be electrically connected to the wiring patterns 206. It should be noted that the connected parts of the LED chips 202 to 204 and the driver IC 205 may be covered with insulating resin by dropping the insulating resin so that the insulating resin surrounds the connected parts.

In the present embodiment, an existing chip bonder can be used, as the pixel substrate 200 has a size of approximately 125 mm×135 mm. Further, it is also possible to operate a plurality of chip bonders in tandem for higher productivity. Although a chip bonder head is usually configured to pick up chips one by one, the present embodiment also makes it possible to simultaneously pick up a plurality of chips separately placed by the size of the pixel substrate 200. This makes it possible to mount chips at a higher speed.

(3) Pixel Substrate Inspecting Step (S30)

In the pixel substrate inspecting step (S30 of FIG. 5), each pixel substrate 200 is inspected for the emission characteristics of light-emitting elements (LED chips) of that pixel substrate 200. This inspection is carried out on all pixel sections. In this inspection, test signals are inputted to the external connection pads 208 to 214 provided in the surface of the pixel substrate 200. Although the following describes an inspection of a single pixel section, an actual inspection can be performed in a shorter amount of time by inspecting a plurality of pixel sections in parallel.

Specifically, in the pixel substrate 200 to be inspected, a DC voltage of 5 V or higher is applied between the external connection pad (external connection terminal 21) that receives the test power voltage TVcc and the external connection pad 214 (external connection terminal 22) that receives the test ground voltage TGND. When a test mode selection signal TE activated to an H level is inputted to the external connection pad 208 (external connection terminal 16), the pixel substrate 200 is set into the test mode.

In the pixel substrate 200 set into the test mode, a test column data signal TR set to a predetermined voltage is inputted to the external connection pad 210 (external connection terminal 18) with the test row section signal TRo activated to an H level, whereby a determination is made as to whether the red LED chip 202 outputs red light at an intensity corresponding to the test column data signal TR, whether the spectrum of the red light falls within a predetermined range, and whether the electric current flowing between the test power sources 21 and 22 falls within a predetermined range. This determination includes, for example, comparing the light output from the red LED chip 202 with a preset threshold range and determining whether the light output is out of the threshold range. Furthermore, it is also possible to change the voltage level of the test column data signal TR and measure a change in the light output from the red LED chip 202 at that point in time. Further, it is also possible to acquire the spectrum of the emitted light and evaluate a peak wavelength and a half-value width at an emission peak. In a case where the peak wavelength and half-value width of the emitted light are out of predetermined ranges, the color gamut of the image display device 1 may become narrower, with the result that the image display device 1 is determined as being defective. Further, in a case where the electric current flowing through the power source is larger than a predetermined value, the image display device 1 may end up with increased power consumption and suffer from problems in terms of quality, with the result that the image display device 1 is determined as being defective.

As for the green LED chip 203 and the blue LED chip 204, determinations which are similar to that made for the red LED chip are made with the test column data signal TG and TB.

In a case where, as a result of the foregoing inspection, any one of the red, green, and blue LED chips constituting a single pixel section does not emit light or the light output from any one of the LED chips is out of the threshold range, the pixel section 3 that includes this LED chip is determined as being defective. The address of the pixel section 3 determined as being defective is recorded as information that specifies a defective pixel section of the pixel substrate 200. The information thus recorded is used in repairing the pixel substrate 200 in the bonding step (S40 of FIG. 5) that follows.

A tester that is used for the foregoing inspection includes probes that make contact with the external connection terminals 16 to 22. The tester has functions of supplying electric currents and voltages to the external connection terminals 16 to 22 and measuring the intensity of light that is emitted by the pixel section 3. Preferably, by controlling these functions, the tester measures the light intensity while applying the electric current and the voltages, records a result of the measurement, and determines whether the result of the measurement falls within a predetermined range. It is preferable that the tester further include a function of measuring the electric current flowing through the power source and a function of measuring the spectrum of the emitted light.

Further, prior to the execution of the bonding step (S40 of FIG. 5), a defective pixel section is removed from the pixel substrate 200. An operation of removing a defective pixel section will be described later.

(4) Bonding Step (S40)

In the bonding step (S40 of FIG. 5), the pixel array section 2 (see FIG. 4) is formed by bonding the plurality of pixel substrates 200 to the base substrate 100. FIG. 11(1) is a cross-sectional view taken along segment A-A shown in FIGS. 6 and 8 with the pixel substrate 200 disposed over the base substrate 100. FIG. 11(2) is a cross-sectional view taken along segment B-B shown in FIGS. 6 and 8.

As shown in FIG. 11, the base substrate 100 and the pixel substrate 200 are disposed to be stacked on top of each other so that the first principal surface 110*a* of the film substrate 110 and the fourth principal surface 201*b* of the film substrate 201 face each other.

The base substrate 100 and the pixel substrate 200 are bonded to each other with insulating resin 221. A usable example of the insulating resin 221 is epoxy resin, acrylic resin, or a mixture of epoxy resin and acrylic resin. The via holes 215 of the pixel substrate 200 are electrically connected to the wiring layers 111 and 112 in the surface of the base substrate 100 by conductive paste 220. This causes the wiring patterns 206 and the wiring layers 111 and 112 to be electrically connected via the via holes 215.

In the bonding step (S40 of FIG. 5), first, the conductive paste 220 is dropped onto the terminal areas 108 (see FIG. 6) of the base substrate 100. The insulating resin 221 is dropped onto portions of peripheral regions surrounding the terminal areas 108.

Next, the pixel substrate 200, whose effective part has been cut out, is aligned with and bonded to the base substrate 100. Prior to the execution of this bonding operation, the pixel substrate 200 is subjected to an operation for removing a defective pixel section detected in the pixel substrate inspecting step (S30 of FIG. 5).

FIG. 12 is a schematic view for explaining an operation of removing defective pixel sections. As shown in FIG. 12(1), the defective pixel sections are removed from the pixel substrates 200 in the pixel substrate inspecting step (S30 of FIG. 5). The parts from which the defective pixel sections have been removed become missing parts where no pixel sections 3 are present.

As shown in FIG. 12(2), the pixel substrates 200 are bonded to the base substrate 100 in a matrix in the bonding step (S40 of FIG. 5). This forms a precursor of the pixel array section 2 shown in FIG. 4. At this point in time, some of the plurality of pixel substrates 200 arranged over the base substrate 100 have missing parts.

Next, on the basis of the address information recorded in the pixel substrate inspecting step (S30), normal pixel sections cut out from a repairing pixel substrate prepared in advance are joined to the missing parts. All of the missing parts are thus filled with the normal pixel sections, whereby, as shown in FIG. 12(3), the pixel substrates 200 are repaired into a state where there are no defective pixel sections.

Note here that the present embodiment raises concern that providing each of the pixel substrates 200 with a test circuit (such as the driver IC 205 and the external connection pads 208 to 214) allows noise to comes in through the external connection pads while the pixel substrate 200 is normally operating, thereby bringing about a side effect of allowing the noise to overlap the light outputs from the LED chips. To address this problem, the external connection pad 208 through which to receive the test mode selection signal TE is electrically connected to the VSS wire 102 of the base substrate 100, as the test circuit is not used once the pixel substrate 200 is bonded to the base substrate 100. This makes it possible to completely fix the test transistors 36 to 39 in an off state, thus making it possible to prevent the aforementioned side effect. It should be noted that in order to electrically connect the external connection pad 208 to the VSS wire 102, it is only necessary to provide a via hole 215 (which is equivalent to TE in the drawing) in a part of the film substrate 201 located under the external connection pad 208. In the present embodiment, in which the test transistors 36 to 39 are constituted by NMOS transistors, the external connection pad 208, which corresponds to the TE terminal, is connected to the VSS wire 102 in order for the test transistors 36 to 39 to be fixed in an off state. However, in a case where the test transistors 36 to 39 are constituted by PMOS transistors, the external connection pad 208 needs to be connected to the VCC wire 101. Whether to fix the TE terminal at VSS or VCC varies depending on the circuit configuration of the driver IC 90. Further, the layout of the pixel substrate is changed.

By executing the steps (S10 to S40 of FIG. 5) described above, the pixel array section 2 shown in FIG. 4 is manufactured. After that, by connecting the group of devices (see FIG. 1) such as the row selection circuit 4, the column signal output circuit 5, and the image processing circuit 6 to the pixel array section 2 thus manufactured, the display 1 is manufactured.

Working Effects

The following describes the working effects of the image display device according to the present embodiment.

(1) Dividing the pixel array section 2 into the base substrate 100 and the pixel substrates 200 makes it easier to inspect the emission characteristics of the pixel sections 3 at the stage of manufacturing the display 1. As for a defective pixel section detected in this inspection, a repair operation of replacing it with a normal pixel section can be performed at the stage of bonding the pixel substrates 200 to the base substrate 100 (bonding step). This results in improvement in yield of the display 1.

(2) In a case where a large-screen display is manufactured, it is not easy to handle a large-sized substrate whose width exceeds 1 m. The present embodiment makes the handling of a substrate easier by forming each of the pixel substrates 200 into a rectangular shape each side of which has a length ranging from several centimeters to 30 cm. Moreover, the present embodiment makes it possible to easily form a large-screen display by spreading these pixel substrates 200 all over the base substrate 100. Further, the present embodiment brings about improved handleability in the step of mounting each of the pixel substrates 200 with the driver IC 205 and the LED chips 202 to 204.

(3) Although the present embodiment has illustrated the configuration of the VGA-compliant display 1, the pixel sections 3 constituting the pixel array section 2 may be increased to 1920×1080 (full high-definition standard). Specifically, a display 1 of the full high-definition standard can be formed by bonding, to the base substrate 100, a total of 135 pixel substrates 200 arranged in nine rows vertically and fifteen columns horizontally in FIG. 4. It should be noted that since the base substrate 100 is as large as 1250 mm×2200 mm, it is preferable that both the first wiring layer 111 and the second wiring layer 112 be formed by an inkjet method.

Thus, in a case where the pixel sections 3 are of uniform size, the present embodiment makes it possible to manufacture displays 1 of various sizes simply by making base substrates 100 of different sizes. This also makes it possible to produce pixel substrates 200 in large numbers and hold them in stock. This in turn makes it possible to respond flexibly and quickly to customers' requests. Further, this also makes it possible to reduce manufacturing costs, as pixel substrates 200 can be produced en bloc. The present embodiment can exhibit an advantageous effect especially in applications such as signage.

(4) Mounting each pixel substrate 200 with a driver IC 205 (see FIGS. 8 and 9) makes active matrix driving of the display 1 possible. This improves the image quality of the display 1.

(5) Allowing the driver IC 205 to have the test function of inspecting the emission characteristics of the LED chips 13 to 15 makes it possible to evaluate not only the emission characteristics of the LED chips but also the characteristics of the pixel section 3 as a whole including driver characteristics. This in turn makes it possible to detect not only a simple defect such as non-lighting but also a harmony defect. Repairing a detected harmony defect makes it possible to improve the image quality of the display 1.

(6) In a case of inspecting the emission characteristics of the pixel section 3 without using the driver IC 205, a test pad through which to receive a test signal needs to be electrically connected to the wiring layers 111 and 112 placed in the surface of the base substrate 100, resulting in increases in load capacitance of the row selection line and the column data lines. This may cause demerits such as a delay of a signal that is supplied to the pixel section 3 and an increase in power consumption. In the present embodiment, the test pads (external connection pad 208 to 213) provided in the surface of the pixel substrate 200 are structured to be electrically connected the driver IC 205 alone and electrically disconnected from the wiring layers in the surface of the base substrate 100. Therefore, the present embodiment cannot have the aforementioned demerits.

(7) The application of single-crystal silicon devices to the driving transistors and test transistors constituting the driver IC 205 makes it possible to reduce the occurrence of variations in threshold voltage of these transistors. This in turn makes it possible to reduce variations in electric current flowing through the LED chips, thus making it possible to prevent degradation in image quality.

(8) Since, as shown in FIGS. 6 and 7, the base substrate 100 are formed with the wiring layers 111 and 112 alone, the wiring layers can be formed by a common inkjet method or the like. This makes it possible to form the wiring layers without a complicated thin-film process, thus making it possible to lessen restrictions on substrate size. This in turn makes it possible to easily manufacture even an large-area base substrate 100 measuring over 100 inches diagonally. Further, it is possible to use, in the base substrate 100, not a glass substrate 100 but a resin substrate (film substrate 110) having flexibility. Furthermore, in the base substrate forming step (S10 of FIG. 5), it is possible to easily check the passage of electricity through the entire wiring layers after having formed the wiring layers 111 and 112. A base substrate 100 determined at this stage as being defective is discarded. This makes it possible to prevent a defective base substrate 100 to be passed on to the subsequent step.

(9) Although the present embodiment has illustrated a configuration in which one driver IC 205 is provided for each pixel section, it is not always necessary to provide each pixel section with a driver IC 90. For example, such a configuration is possible that a plurality of pixel sections that are adjacent to each other in a row-wise direction or a column-wise direction share one driver IC 90. An increase in the number of pixel sections that are controlled by one driver IC 90 may cause an increase in chip size of the single driver IC 90 but, on the other hand, makes it possible to reduce the number of driver ICs 90 with which a pixel substrate 200 is mounted. This makes it possible to reduce the manufacturing cost of pixel substrates 200. A configuration in which two pixel sections share a driver IC 90 will be described later.

(10) Although it is also possible to use one pixel substrate 200 for each pixel section, it is preferable, from the point of view of productivity, that one substrate be mounted with a plurality of pixel sections. For example, in the case of pixel sections each measuring 1 mm per side, one pixel substrate having an effective region measuring 15 cm per side can be mounted with 22.5 thousand of these pixel sections.

(11) Although the present embodiment assumes that the pitches between pixels in the surface of a pixel substrate 200 are equal to the pitches between pixels in the surface of a base substrate 100 are equal, the pitches between pixels are not limited to this assumption. For example, the pitches between pixels in the surface of a pixel substrate 200 are formed to be narrower than the pitches between pixels in the surface of a base substrate 100, and after the pixel substrate 200 has been pasted to an adhesive substrate, the pixel substrate 200 is divided into pixel sections 3. Furthermore, this adhesive substrate may be stretched and, with the pixel pitches increased, may be bonded to the base substrate 100.

(12) Although, in the present embodiment, the base substrate 100 is configured such that the wiring layers 111 and 112 are placed over the first principal surface 110a of the film substrate 110, the wiring layers may be placed over the second principal surface 110b instead of or together with the first principal surface 110a. In this case, providing via holes in the base substrate 100 makes it possible to electrically connect the wiring layers 111 and 112 over the second principal surface 110b to the wiring patterns 206 in the surface of the pixel substrate 200. Alternatively, although, in the present embodiment, the pixel substrate 200 is configured such that the wiring patterns 206 are placed on the third principal surface 201a of the film substrate 201, the wiring patterns may be placed on the fourth principal surface 201b instead of or together with the third principal surface 201a. In this case, the LED chips 202 to 204, driver IC 205, and external connection pads 208 to 212 mounted over the third principal surface 201a and the wiring patterns on the fourth principal surface 201b can be electrically connected by the via holes provided in the film substrate 201.

The following describes modifications of the image display device according to the first embodiment. Each of the modifications is an example, and it is needless to say that a partial substitution or combination with a configuration shown in a different modification is possible.

Second Embodiment

Second and third embodiments describe other example configurations of the pixel substrate 200.

Figure 13:
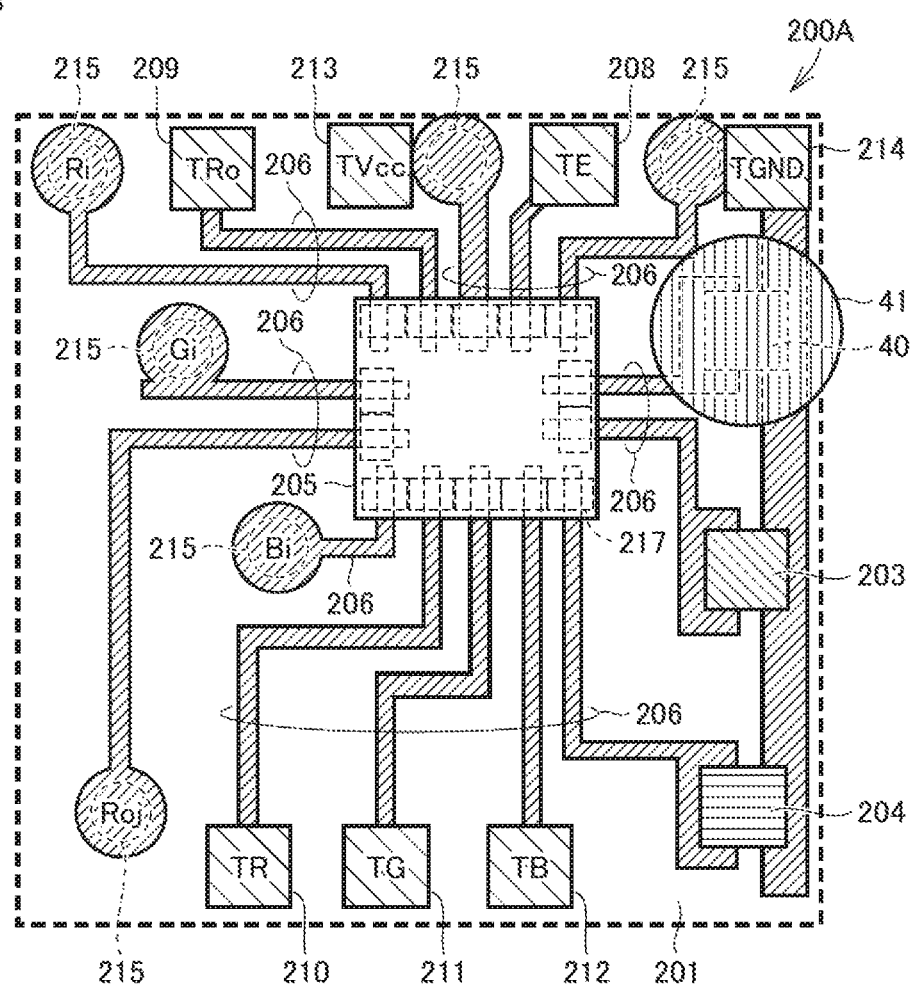
FIG. 13 is a plan view of a pixel substrate of an image display device according to a second embodiment of the present invention.

FIG. 13 is a plan view of a pixel substrate 200A of an image display device according to the second embodiment of the present invention. The basic configuration of the image display device according to the present embodiment is the same as that of the image display device 1 shown in FIG. 1 except for the configuration of the pixel substrate 200A and, as such, is not described here.

As shown in FIG. 13, the pixel substrate 200A is identical in basic configuration to the pixel substrate 200 shown in FIG. 8, except that the pixel substrate 200A includes a blue-violet LED chip 40 and a red phosphor 41 as a red light-emitting element instead of including the red LED chip 202.

The blue-violet LED chip 40 emits blue-violet light whose peak wavelength ranges from 390 nm to 420 nm. The blue-violet LED chip 40 is for example a nitride semiconductor LED chip.

The red phosphor 41 is excited by light emitted from the blue-violet LED chip 40 and produces light having a fluorescence peak wavelength within a wavelength range of 600 nm to 670 nm.

The red phosphor 41, obtained by causing particles of a wavelength-conversion substance shown below to be dispersed in silicon resin or the like, covers the blue-violet LED chip 40. Suitably utilizable examples of the wavelength-conversion substance include, but are not particularly limited to, a phosphor (KSF phosphor) having a $K_2SiF_6:Mn^{4+}$ structure, a $Ba_2ZnS_3:Mn$ phosphor, a phosphor (CASN phosphor) having a $Eu^{2+}$-activated $CaAlSiN_3$ structure, a zinc selenium red phosphor, a $La_2O_2S:Eu$ phosphor, a $0.5MgF_2.3.5MgO.GeO_2:Mn$ phosphor, a CaS:Eu,Tm phosphor, a $Gd_2O_2S:Eu$ phosphor, a CaS:Eu phosphor, a YAG:Ce phosphor, and the like. Alternatively, it is also possible to utilize a wavelength-conversion material composed of quantum dots obtained by forming CdSe, CdS, or the like into nanometer-size ultrafine particles. Of these phosphors, the KSF phosphor has the advantage in widening the color gamut, as it has a sharp emission peak wavelength within a wavelength range of 625 nm to 645 nm.

The red LED chip 202 shown in FIG. 8 is usually made of an InGaAlP compound semiconductor material. In general, an InGaAlP compound semiconductor material tends to become much lower in luminance due to an increase in temperature than a nitride semiconductor material of which the green LED chip 203 and the blue LED chip 204 are made of. Therefore, in a case where the red LED chip 202 is used in the red light-emitting element, an increase in operating temperature of the chip due to operating environmental temperature or operating time leads to lower luminance, possibly causing a color imbalance in the pixel array section 2 as a result.

By combining the blue-violet LED chip 40 and the red phosphor 41 to construct the red light-emitting element, the present embodiment makes it possible to solve such a problem.

In the present embodiment, the blue-violet LED chip 40 is flip-chip bonded to the wiring patterns 206 instead of the red LED chip 202 in the pixel substrate forming step (S20 of FIG. 5). After that, the silicon resin containing the red phosphor 41 is dropped onto the blue-violet LED chip 40 and hardened.

Third Embodiment

Figure 14:
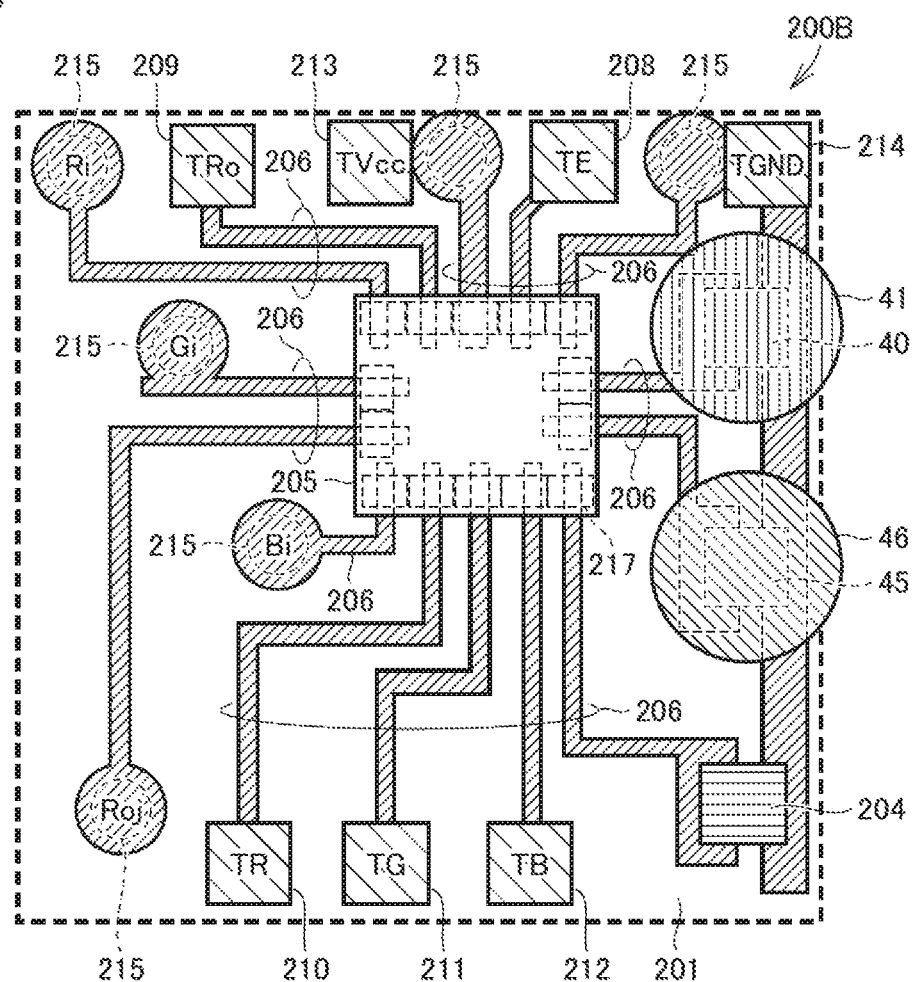
FIG. 14 is a plan view of a pixel substrate of an image display device according to a third embodiment of the present invention.

FIG. 14 is a plan view of a pixel substrate 200B of an image display device according to a third embodiment of the present invention. The basic configuration of the image display device according to the present embodiment is the same as that of the image display device 1 shown in FIG. 1 except for the configuration of the pixel substrate 200B and, as such, is not described here.

As shown in FIG. 14, the pixel substrate 200B is identical in basic configuration to the pixel substrate 200 shown in FIG. 8, except that the pixel substrate 200B includes a blue-violet LED chip 40 and a red phosphor 41 as a red light-emitting element instead of including the red LED chip 202 and includes a blue-violet LED chip 45 and a green phosphor 46 as a green light-emitting element instead of including the green LED chip 203.

The red light-emitting element is identical in configuration to the red light-emitting element shown in FIG. 12. Further, the blue-violet LED chip 45 is identical in configuration to the blue-violet LED chip 40 of the red light-emitting element.

The green phosphor 46 is excited by light emitted from at least the blue-violet LED chip 45 and produces light having a fluorescence peak wavelength within a wavelength range of 500 nm to 580 nm.

The green phosphor, obtained by causing particles of a wavelength-conversion substance shown below to be dispersed in silicon resin or the like, covers the blue-violet LED chip 40. Possible examples of the wavelength-conversion substance include, but are not particularly limited to, a bivalent Eu-activated oxynitride phosphor (β-type SiAlON) represented by general formula $Eu_aSi_bAl_cO_dN_e$ (where 0.005≤a≤0.4, b+c=12, and d+e=16 are satisfied). Alternatively, the wavelength-conversion substance may be a bivalent Eu-activated silicate phosphor represented by general formula $(Ba_{1-f-g}(M1)_fEu_g)O.SiO_2$ (where M1 represents at least one type of alkaline-earth metal element of Mg, Ca, and Sr and 0<f≤0.55 and 0.03≤g≤0.10 are satisfied) or general formula $((M2)_{1-h}, Eu_h)O.SiO_2$ (where M2 represents at least one type of element of Mg, Ca, Sr, and Ba and 0.005≤h≤0.10 is satisfied). Alternatively, it is also possible to utilize a wavelength-conversion material composed of quantum dots obtained by forming CdSe, CdS, or the like into nanometer-size ultrafine particles.

The green LED chip 203, which is made of a nitride semiconductor material, tends to be inferior in efficiency than the blue LED chip 204. Therefore, the green LED chip 203 needs to be larger in chip size than the blue LED chip 204 in order to produce an equal light output, undesirably leading to an increase in cost. Further, an increase in driving current undesirably leads to an increase in power consumption.

By combining the blue-violet LED chip 45 and the green phosphor 46 to construct the green light-emitting element, the present embodiment makes it possible to solve such a problem.

Fourth Embodiment

Fourth to eleventh embodiments describe example circuit configurations of the driver ICs 205 of the pixel substrates 200 (FIG. 8), 200A (FIG. 13), and 200B (FIG. 14).

Figure 15:
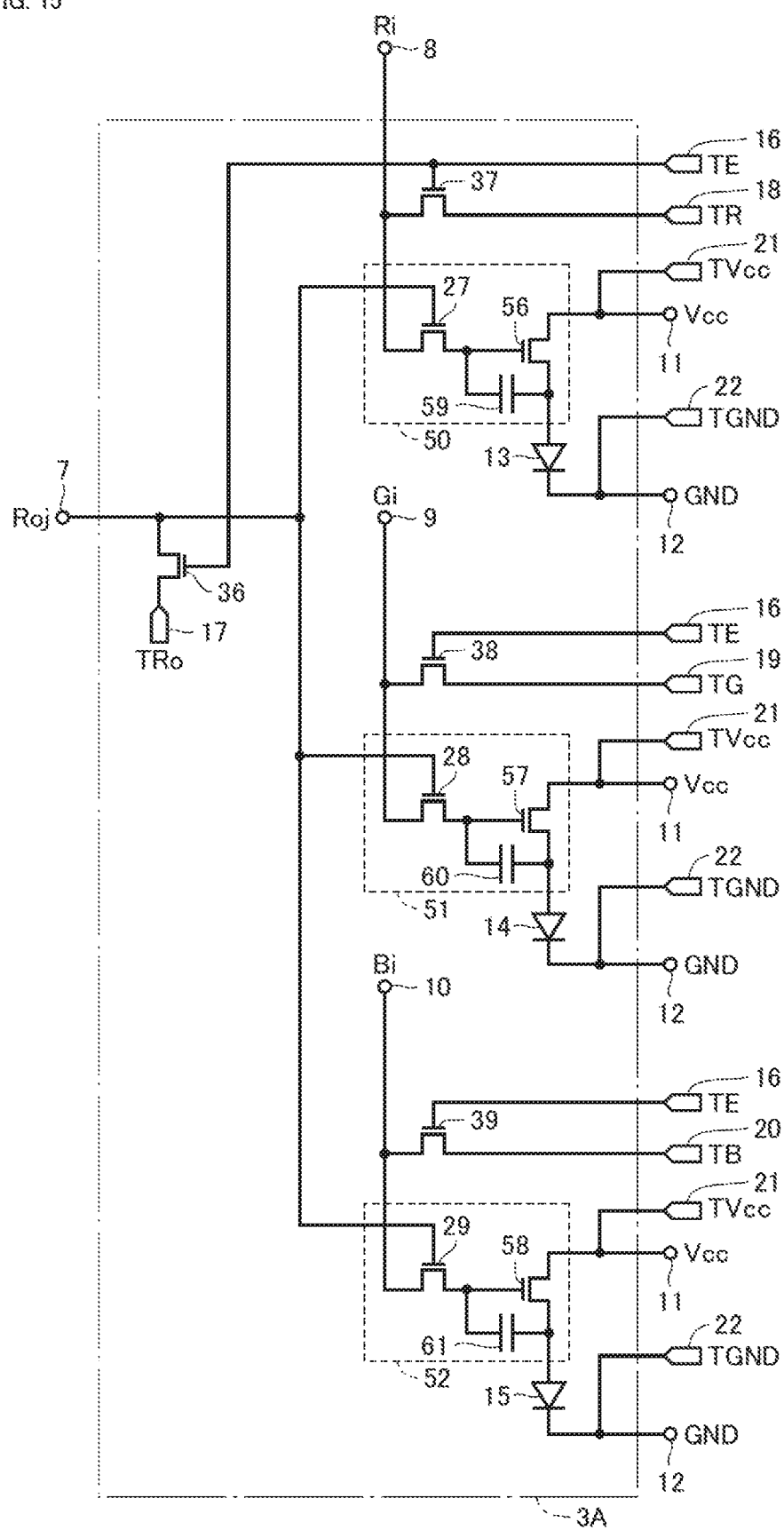
FIG. 15 is a diagram showing a circuit configuration of a pixel section of an image display device according to a fourth embodiment of the present invention.

FIG. 15 is a diagram showing a circuit configuration of a pixel section 3A of an image display device according to the fourth embodiment of the present invention. The basic configuration of the image display device according to the present embodiment is the same as that of the image display device 1 shown in FIG. 1 except for the configuration of the pixel section 3A and, as such, is not described here.

As shown in FIG. 15, the pixel section 3A is identical in basic configuration to the pixel section 3 shown in FIG. 3, except that the driving sections 23 to 25 are replaced by driving sections 50 to 52, respectively.

The driving section 50 differs from the driving section 23 in that, instead of including the driving transistor 30 composed of a PMOS transistor, the driving section 50 includes a driving transistor 56 composed of an NMOS transistor. The driving transistor 56 has its gate connected to the source of the selection transistor 27, its drain connected to the input terminal 11 and the external connection terminal 21, and its source connected to the anode of the red LED chip 13. A storage capacitor 59 is connected between the gate and source of the driving transistor 56.

The driving section 51 differs from the driving section 24 in that, instead of including the driving transistor 31 composed of a PMOS transistor, the driving section 51 includes a driving transistor 57 composed of an NMOS transistor. The driving transistor 57 has its gate connected to the source of the selection transistor 28, its drain connected to the input terminal 11 and the external connection terminal 21, and its source connected to the anode of the green LED chip 14. A storage capacitor 60 is connected between the gate and source of the driving transistor 57.

The driving section 52 differs from the driving section 25 in that, instead of including the driving transistor 32 composed of a PMOS transistor, the driving section 52 includes a driving transistor 58 composed of an NMOS transistor. The driving transistor 58 has its gate connected to the source of the selection transistor 29, its drain connected to the input terminal 11 and the external connection terminal 21, and its source connected to the anode of the blue LED chip 15. A storage capacitor 61 is connected between the gate and source of the driving transistor 58.

The first embodiment is configured such that the driving currents of the LED chips 13 to 15 are determined by reading the column data signal Ri, Gi, and Bi into the driving transistors 30 to 32 inside the driving sections 23 to 25 upon entering into the period of selection of the jth row. In the present embodiment, the driving currents of the LED chips 13 to 15 are determined by performing the following three stages of operation upon entering into the period of selection of the jth row.

At the first stage of operation, the potentials of the column data signal Ri, Gi, and Bi are kept at 0 V. This rests the potentials of the gates of the driving transistors 56 to 58 to 0 V.

Next, at the second stage of operation, the potentials of the column data signal Ri, Gi, and Bi are raised to VA (VA>0). VA satisfies the relationship VDT<VA<VDT+VON, where VDT is the threshold voltages of the driving transistors 56 to 58 and VON is the turn-on voltages of the LED chips 13 to 15. Having raised the potentials of the gates to VA causes the gate-source voltages of the driving transistors 56 to 58 to be substantially equal to VDT.

Finally, at the third stage of operation, the potentials of the column data signal Ri, Gi, and Bi are raised to VB, which is higher than VA (VB>VA). The second stage of operation has caused the potentials of the sources of the driving transistors 56 to 58 to be substantially equal to VA−VDT. Therefore, the gate-source voltages of the driving transistors 56 to 58 are VDT−(VA−VB). Of these gate-source voltages, (VA−VB) takes on a constant value that is not affected by the threshold voltages VDT of the driving transistors 56 to 58. This makes it possible to reduce the influence of variations in threshold voltage of the driving transistors 56 to 58.

Fifth Embodiment

Figure 16:
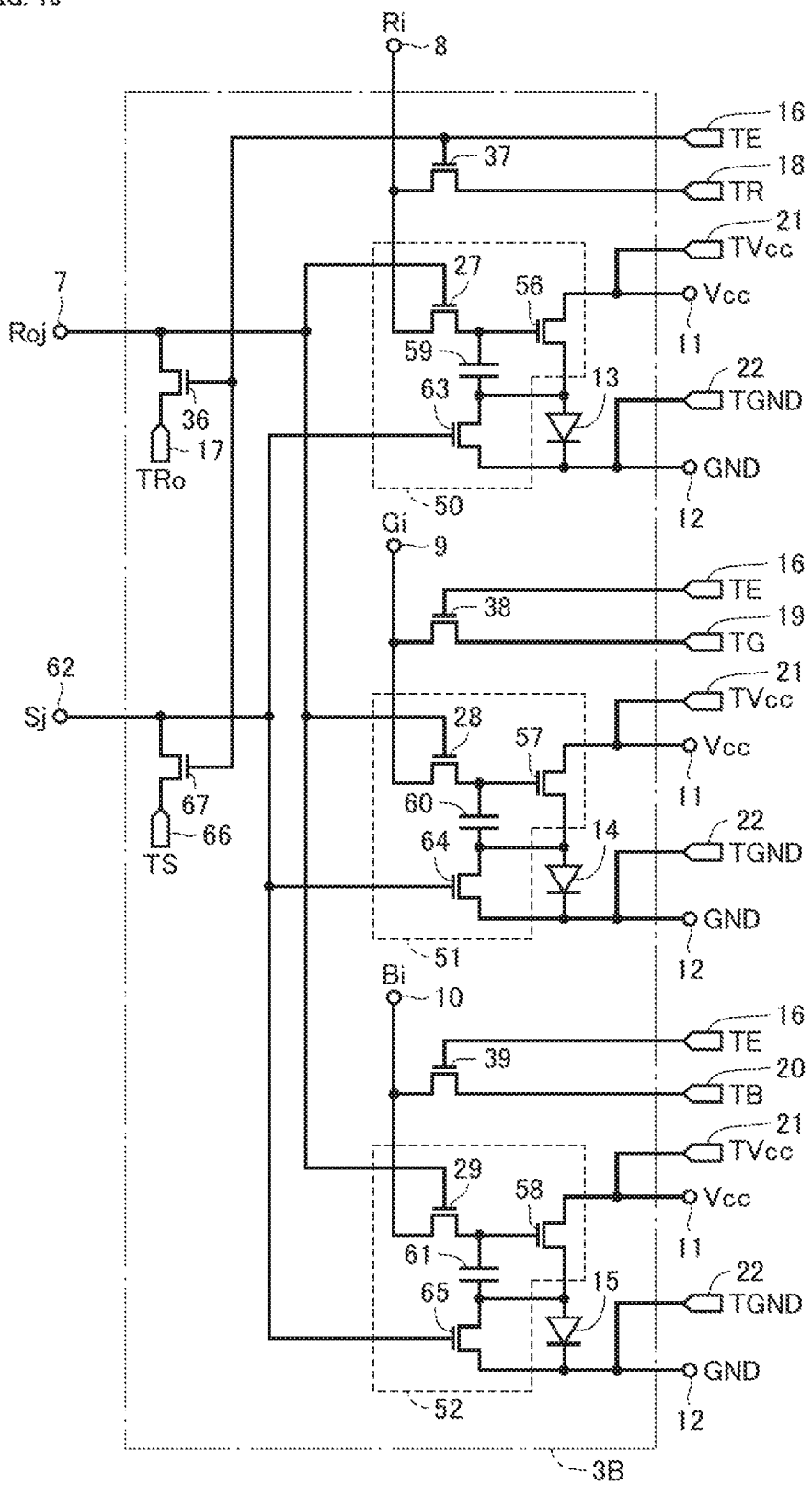
FIG. 16 is a diagram showing a circuit configuration of a pixel section of an image display device according to a fifth embodiment of the present invention.

FIG. 16 is a diagram showing a circuit configuration of a pixel section 3B of an image display device according to the fifth embodiment of the present invention. The basic configuration of the image display device according to the present embodiment is the same as that of the image display device 1 shown in FIG. 1 except for the configuration of the pixel section 3B and, as such, is not described here.

As shown in FIG. 16, the pixel section 3B is identical in basic configuration to the pixel section 3A shown in FIG. 15, except that switching transistors 63 to 65 are added to the driving sections 50 to 52, respectively, and an input terminal 62, an external connection terminal 66, and a test transistor 67 are newly provided.

The input terminal 62 receives a control signal Sj for controlling the turning on and turning off of the switching transistors 63 to 65. The external connection terminal 66 receives a test control signal TS for controlling the turning on and turning off of the switching transistors 63 to 65 during the test mode. The test transistor 67 is composed of an NMOS transistor. The test transistor 67 has its gate connected to the external connection terminal 16, its drain connected to the input terminal 62, and its source connected to the external connection terminal 66.

In the driving section 50, the switching transistor 63 is connected in parallel with the red LED chip 13 between the source of the driving transistor 56 and the input terminal 12 and between the source of the driving transistor 56 and the external connection terminal 22. The switching transistor 63 is composed of an NMOS transistor. The switching transistor 63 has its gate connected to the input terminal 62.

In the present embodiment, as in the fourth embodiment described above, the driving currents of the LED chips 13 to 15 are determined by performing the three stages of operation upon entering into the period of selection of the jth row. Note, however, that, in the present embodiment, the turning on and turning off of the switching transistors 63 to 65 are controlled according to the stages.

Specifically, at the first stage, the switching transistors 63 to 65 are turned on by keeping the potentials of the column data signals Ri, Gi, and Bi at 0 V and inputting the control signal Sj activated to an H level to the input terminal 62.

By bringing the switching transistors 63 to 65 into an on state, the sources of the driving transistors 56 to 58 and one terminal of each of the storage capacitors 59 to 61 are connected directly to the ground voltage GND without the LED chips 13 to 15. This makes it possible to surely reset the potentials of the driving transistors 56 to 58 to 0 V.

On the other hand, at the second and third stages, the switching transistors 63 to 65 are brought into an off state so that the LED chips 13 to 15 are not prevented from being driven by electric currents.

During the test mode, the turning on of the test transistor 67 by the mode selection signal TE activated to an H level causes the turning on and turning off of the switching transistors 63 to 65 to be controlled by the test control signal TS instead of the control signal Sj. The control of the switching transistors 63 to 65 during the test mode is the same as the control of the switching transistors 63 to 65 during the normal operation described above and, as such, is not described in detail here.

The present embodiment improves the accuracy of control of the gate-source voltages of the driving transistors 56 to 58, thus making it possible to enhance the effect of reducing the influence of variations in threshold voltage in the fourth embodiment.

Sixth Embodiment

Figure 17:
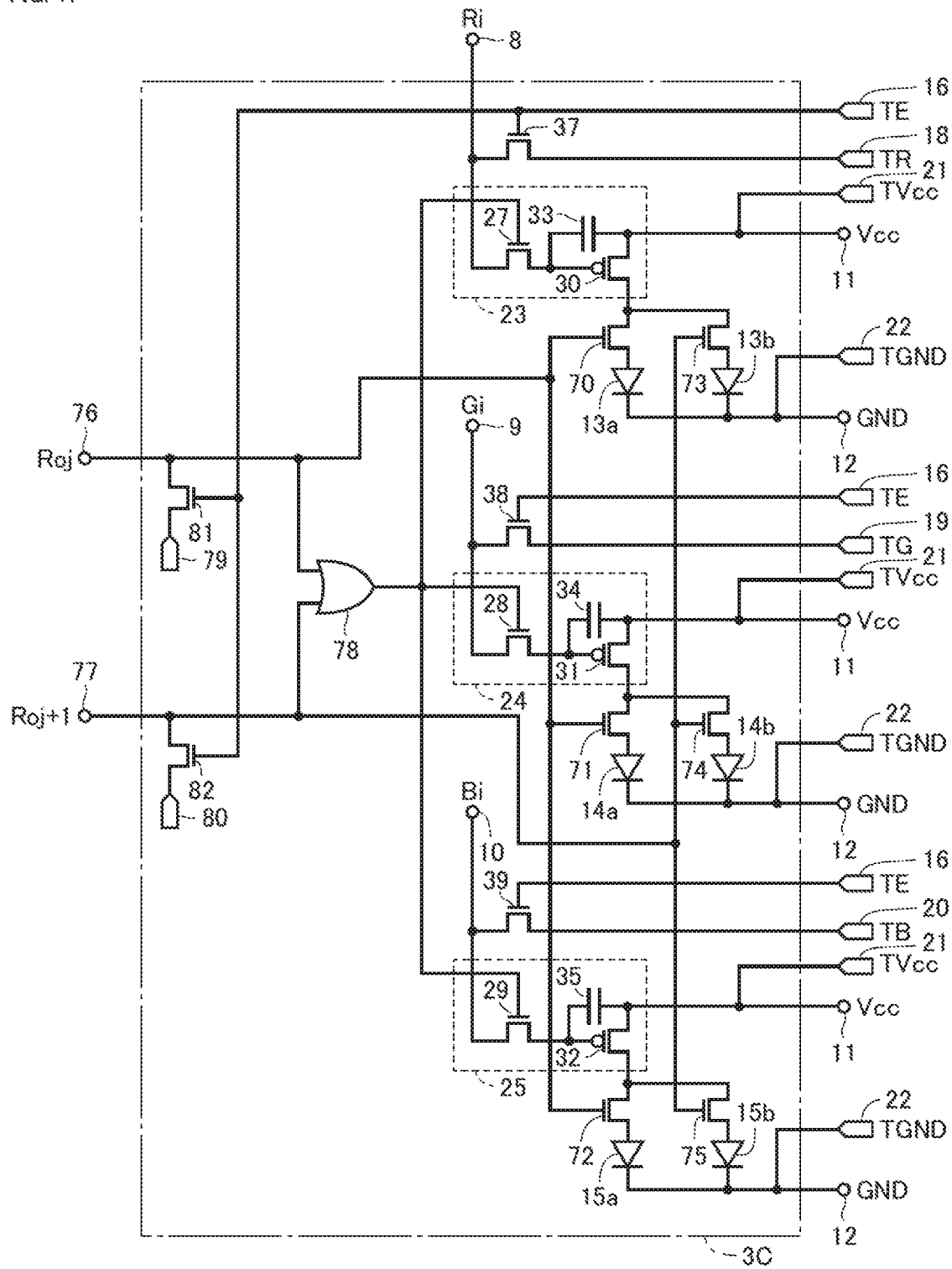
FIG. 17 is a diagram showing a circuit configuration of a pixel section of an image display device according to a sixth embodiment of the present invention.

FIG. 17 is a diagram showing a circuit configuration of a pixel section 3C of an image display device according to the sixth embodiment of the present invention. The basic configuration of the image display device according to the present embodiment is the same as that of the image display device 1 shown in FIG. 1 except for the configuration of the pixel section 3C and, as such, is not described here.

As shown in FIG. 17, the pixel section 3C is configured such that two adjacent pixel sections 3(i, j) and 3(i, j+1) belonging to a common column are integrated with each other. Each of the pixel sections is identical in basic configuration to the pixel section 3 shown in FIG. 3, except that the two pixel sections share a driver IC 90c with each other.

That is, the pixel section 3 shown in FIG. 3 includes LED chips 13 to 15, which constitutes a single pixel, and the driver IC 90 for driving these LED chips 13 to 15. On the other hand, the pixel section 3C includes LED chips 13a to 15a constituting a single pixel section, LED chips 13b to 15b constituting another adjacent pixel section belonging to the same column as the single pixel, and a single driver IC 90c for selectively driving the LED chips 13a to 15a and the LED chips 13b to 15b.

Specifically, the two red LED chips 13a and 13b are connected in parallel between the drain of the driving transistor 30 of the driving section 23 and the input terminal 12 and between the drain of the driving transistor 30 of the driving section 23 and the external connection terminal 22. An LED selection transistor 70 composed of an NMOS transistor is connected between the drain of the driving transistor 30 and the anode of the red LED chip 13a. An LED selection transistor 73 composed of an NMOS transistor is connected between the drain of the driving transistor 30 and the anode of the red LED chip 13b. The LED selection transistor 70 has its gate connected to an input terminal 76 of the row selection signal Roj for selecting the jth row. The LED selection transistor 73 has its gate connected to an input terminal 77 of a row selection signal Roj+1 for selecting the (j+1)th row.

The two green LED chips 14a and 14b are connected in parallel between the drain of the driving transistor 31 of the driving section 24 and the input terminal 12 and between the drain of the driving transistor 31 of the driving section 24 and the external connection terminal 22. An LED selection transistor 71 composed of an NMOS transistor is connected between the drain of the driving transistor 31 and the anode of the green LED chip 14a. An LED selection transistor 74 composed of an NMOS transistor is connected between the drain of the driving transistor 31 and the anode of the green LED chip 14b. The LED selection transistor 71 has its gate connected to the input terminal 76, and the LED selection transistor 74 has its gate connected to the input terminal 77.

The two blue LED chips 15a and 15b are connected in parallel between the drain of the driving transistor 32 of the driving section 25 and the input terminal 12 and between the drain of the driving transistor 32 of the driving section 25 and the external connection terminal 22. An LED selection transistor 72 composed of an NMOS transistor is connected between the drain of the driving transistor 32 and the anode of the blue LED chip 15a. An LED selection transistor 75 composed of an NMOS transistor is connected between the drain of the driving transistor 32 and the anode of the blue LED chip 15b. The LED selection transistor 72 has its gate connected to the input terminal 76, and the LED selection transistor 75 has its gate connected to the input terminal 77.

The row selection signal Roj is inputted to a first input terminal of an OR (logical sum) circuit 78, and the row selection signal Roj+1 is inputted to a second input terminal of the OR circuit 78. The OR circuit 78 has its output terminal connected to the gates of the selection transistors 27 to 29. The OR circuit 78 calculates the logical sum of the row selection signals Roj and Roj+1 and inputs a result of the calculation to the gates of the selection transistors 27 to 29.

A test row selection signal TRo1 for selecting the jth row during the test mode is inputted to an external connection terminal 79. A test row selection signal TRo2 for selecting the (j+1)th row during the test mode is inputted to an external connection terminal 80. Test transistors 81 and 82 are composed of NMOS transistors. The test transistor 81 has its gate connected to the external connection terminal 16, its drain connected to the gates of the LED selection transistors 70 to 72, and its source connected to the external connection terminal 79. The test transistor 82 has its gate connected to the external connection terminal 16, its drain connected to the gates of the LED selection transistors 73 to 75, and its source connected to the external connection terminal 80.

When the test transistors 81 and 82 become turned on upon receiving the test mode selection signal TE activated to an H level, the test selection signal TRo1 is inputted to the first terminal of the OR circuit 78 and the test selection signal TRo2 is inputted to the second terminal. The OR circuit 78 calculates the logical sum of the test selection signals TRo1 and TRo2 and inputs a result of the calculation to the gates of the selection transistors 27 to 29.

In the foregoing configuration, during the period of selection of the jth row, the red LED chip 13a, the green LED chip 14a, and the blue LED chip 15a are selected by the LED selection transistors 70 to 72 becoming turned on upon receiving the row selection signal Roj (or the test row selection signal TRo1) activated to an H level. When the selection transistors 27 to 29 become turned on upon receiving an H-level output signal from an OR circuit 48, the column data signals Ri, Gi, and Bi (or the test column data signals TR, TG, and TG) are inputted to the gates of the driving transistors 30 to 32, respectively. As a result of this, the red LED chip 13a emits red light at an intensity corresponding to the column data signal Ri (or the test column data signal TR), the green LED chip 14a emits green light at an intensity corresponding to the column data signal Gi (or the test column data signal TG), and the blue LED chip 15a emits blue light at an intensity corresponding to the column data signal Bi (or the test column data signal TB).

Meanwhile, during the period of selection of the (j+1)th row, the red LED chip 13b, the green LED chip 14b, and the blue LED chip 15b are selected by the LED selection transistors 73 to 75 becoming turned on upon receiving the row selection signal Roj+1 (or the test row selection signal TRo2) activated to an H level. When the selection transistors 27 to 29 become turned on upon receiving an H-level output signal from the OR circuit 48, the column data signals Ri, Gi, and Bi (or the test column data signals TR, TG, and TG) are inputted to the gates of the driving transistors 30 to 32, respectively. As a result of this, the red LED chip 13b emits red light at an intensity corresponding to the column data signal Ri (or the test column data signal TR), the green LED chip 14b emits green light at an intensity corresponding to the column data signal Gi (or the test column data signal TG), and the blue LED chip 15b emits blue light at an intensity corresponding to the column data signal Bi (or the test column data signal TB).

Since the pixel section 3C according to the present embodiment is configured such that two pixel sections belonging to a common column share the driving sections 23 to 24 and the test transistors 37 to 39 with each other, it is possible to provide every two pixel sections with one driver IC 90c. In the present embodiment, since the LED selection transistors 70 to 75, the test transistors 81 and 82, and the OR circuit 78 are newly added to the circuit configuration of the driver IC 90c, the circuit area of each driver IC 90c may be larger than the circuit area of the driver IC 90 of the pixel section 3. However, a comparison between pixel substrates 200 having equal numbers of pixels shows that a pixel substrate 200 constituted by pixel sections 3 is mounted with half as many driver ICs 205 as a pixel substrate 200 constituted by pixel sections 3C. This makes it possible to shorten the man-hour of the pixel substrate forming step (S20 of FIG. 5), thus making it possible to reduce the manufacturing cost of pixel substrates 200.

It should be noted that, in the present embodiment, in which the two pixel sections 3(i, j) and 3(i, j+1) belonging to adjacent rows share the driving sections 23 to 25 with each other, it is necessary to end the emission of the LED chips 13a to 15a of the pixel section 3(i, j+1) within the period of selection of the jth row and it is therefore impossible to keep the LED chips 13a to 15a emitting light in the period of selection of the (j+1)th row. This makes it necessary to increase the light outputs by passing larger currents through the LED chips 13a to 15a than in a case where the driving sections 23 to 25 are not shared. For example, the full high-definition standard makes it necessary to cause the LED chips 13a to 15a to emit light in a period of approximately $\frac{1}{1000}$, thus making it necessary to make their emission intensities approximately 1000 times as high. The LED chips that are used in the present embodiment allow passage of such amounts of current as to be able to meet the need.

Further, although the present embodiment describes a case where two adjacent pixels share a driver IC with each other, it is alternatively possible, in the same line of thought, that a larger number of adjacent pixels may share a driver IC with each other.

Seventh Embodiment

Figure 18:
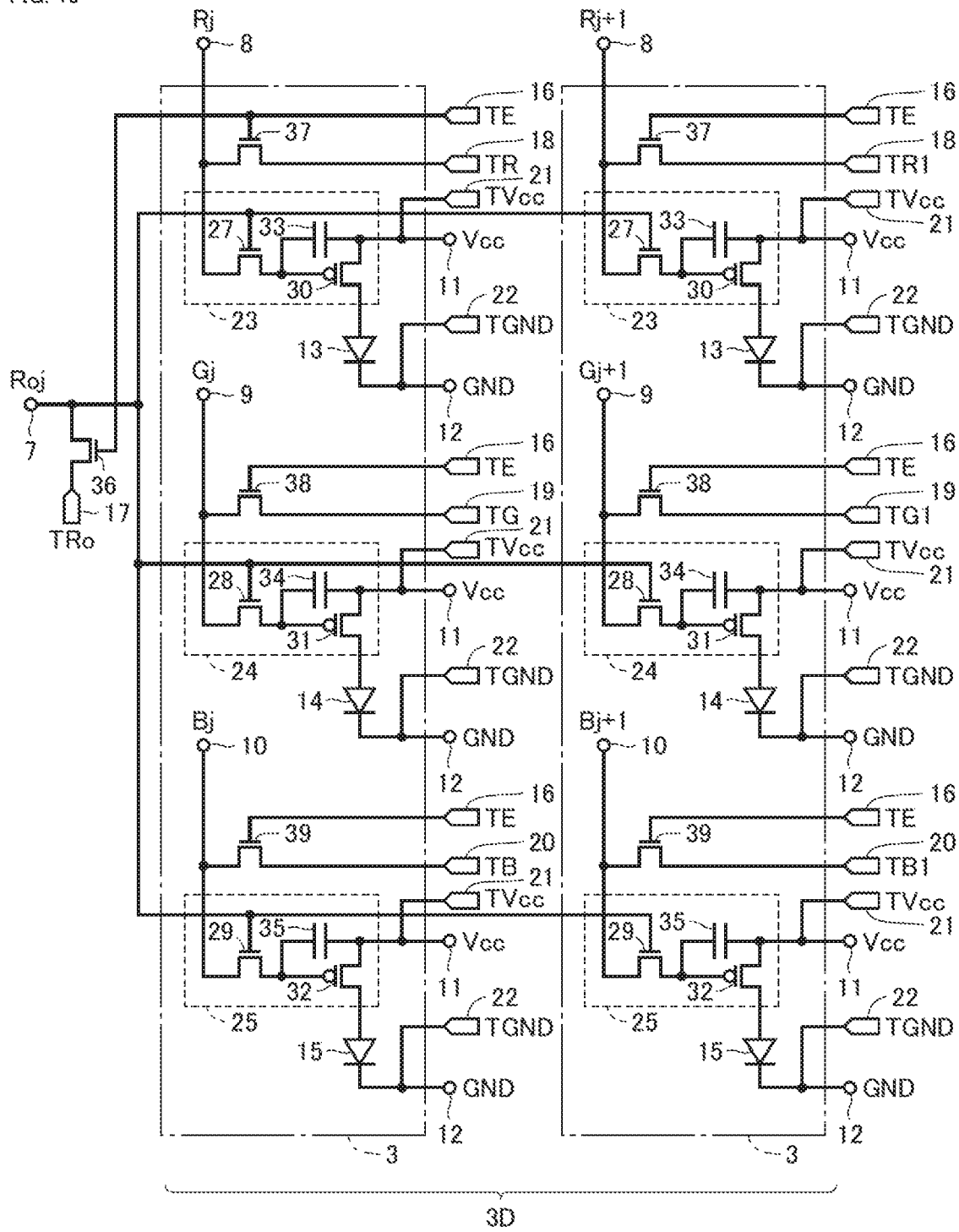
FIG. 18 is a diagram showing a circuit configuration of a pixel section of an image display device according to a seventh embodiment of the present invention.

FIG. 18 is a diagram showing a circuit configuration of a pixel section 3D of an image display device according to the seventh embodiment of the present invention. The basic configuration of the image display device according to the present embodiment is the same as that of the image display device 1 shown in FIG. 1 except for the configuration of the pixel section 3D and, as such, is not described here.

As shown in FIG. 18, the pixel section 3D is configured such that two adjacent pixel sections 3(i, j) and 3(i+1, j) belonging to a common row are integrated with each other. Each of the pixel sections is identical in basic configuration to the pixel section 3 shown in FIG. 3, except that the two pixel sections share a driver IC 90d with each other.

Specifically, the pixel section 3D includes a pixel section 3(i, j), a pixel section 3(i+1, j), and a test transistor 36. In the foregoing configuration, the driving sections 23 to 25 and test transistors 37 to 39 of the pixel section 3(i, j), the driving sections 23 to 25 and test transistors 37 to 39 of the pixel section 3(i+1, j), and the test transistor 36 are built in one driver IC 90d.

Each of the pixel sections 3(i, j) and 3(i+1, j) is identical in basic configuration to the pixel section 3 shown in FIG. 3, except that the pixel section 3(i, j) and the pixel section 3(i+1, j) share the test transistor 36 with each other.

The pixel section 3D according to the present embodiment, in which the two pixel sections 3(i, j) and 3(i+1, j) are simultaneously driven upon receiving the row selection signal Roj, cannot share the driving sections 23 to 25 between the two pixel sections unlike in the pixel section 3C shown in FIG. 17. As a result, the test transistor 36 for transmitting the test row selection signal TRo is the only part that the two pixel sections can share with each other. This makes the pixel section 3D less effective than the pixel section 3C in reducing the area of the driver IC 90d. Note, however, that, as with the pixel section 3C, the pixel section 3D makes it possible to halve the number of driver ICs, thus making it possible to reduce the manufacturing cost of pixel substrates 200.

Further, although the present embodiment describes a case where two adjacent pixels share a driver IC with each other, it is alternatively possible, in the same line of thought, that a larger number of adjacent pixels may share a driver IC with each other.

Eighth Embodiment

Figure 19:
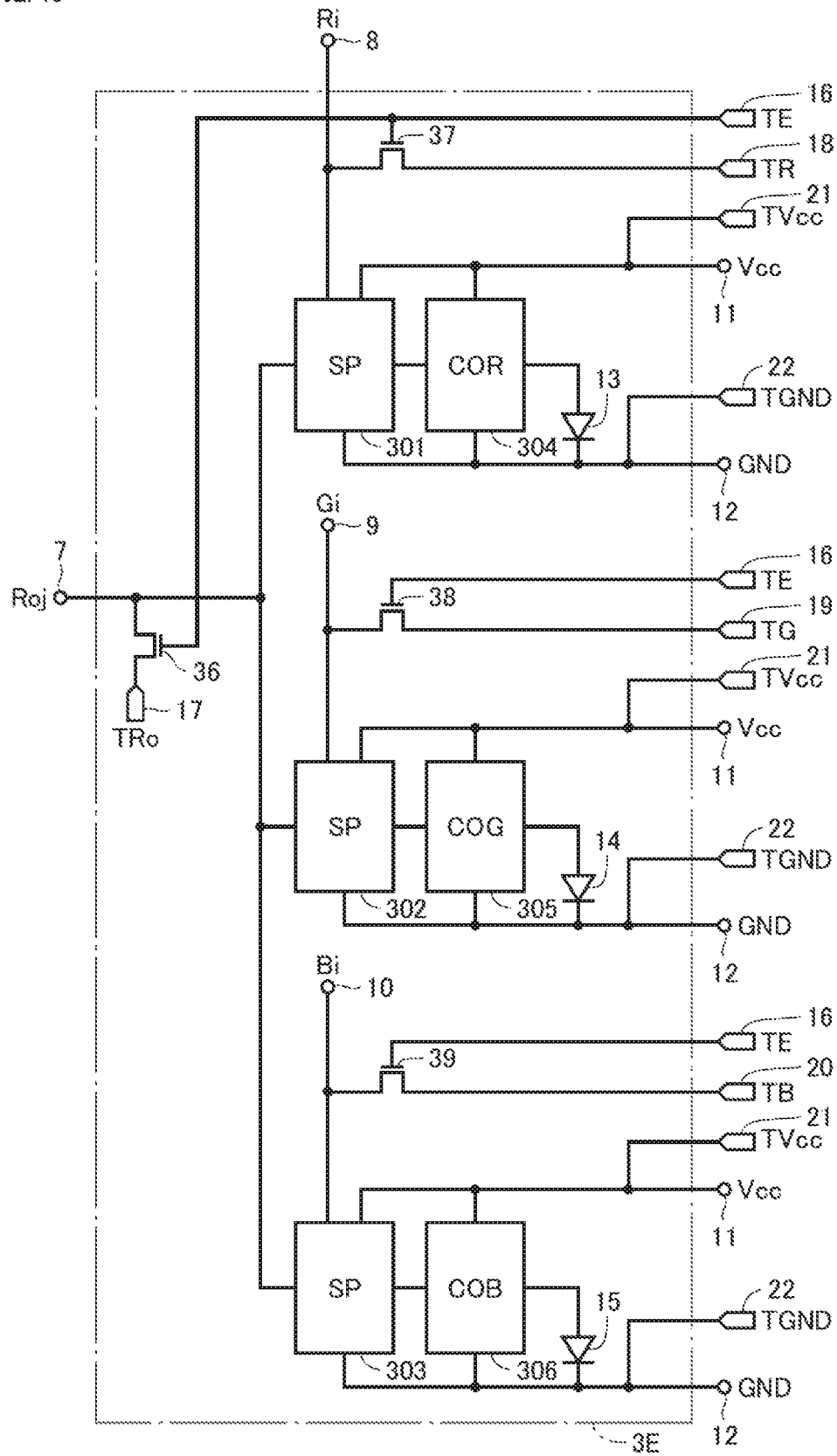
FIG. 19 is a diagram showing a circuit configuration of a pixel section of an image display device according to an eighth embodiment of the present invention.

FIG. 19 is a diagram showing a circuit configuration of a pixel section 3E of an image display device according to the eighth embodiment of the present invention. The basic configuration of the image display device according to the present embodiment is the same as that of the image display device 1 shown in FIG. 1 except for the configuration of the pixel section 3E and, as such, is not described here.

As shown in FIG. 19, the pixel section 3E is identical in basic configuration to the pixel section 3 shown in FIG. 3, except that the column data signals Ri, Gi, and Bi are not analog signals but digital signals.

Conventionally, since liquid crystal displays and organic EL displays are formed on glass substrates, driving elements that drive pixels are usually constituted by thin-film transistors. Thin-film transistors are generally lower in driving capability and greater in characteristic variation than silicon transistors and, as such, have imposed great restrictions on the functions that the driving elements might be able to fulfill.

Meanwhile, the present embodiment, in which driver ICs including driving elements are manufactured by silicon LSI technologies, allows the driving elements to have more advanced functions. Accordingly, by allowing the driver ICs to have a digital/analog conversion function, the present embodiment controls the light outputs of the pixels with digital signals.

The following describes the configuration and operation of a driver IC 90e according to the present embodiment.

The column signal output circuit 5 (see FIG. 1) transmits the column data signals Ri, Gi, and Bi as serial digital signals. Serial transmission is used because it is disadvantageous in terms of cost to place a large number of thin signal lines in the surface of the base substrate in the base substrate forming step (S10 of FIG. 5).

For example, in a case where each of the column data signals Ri, Gi, and Bi has a 8-bit length, an attempt to transmit the column data signals Ri, Gi, and Bi in parallel requires at least 8×3=24 signal lines. This requires the signal lines to be placed at finer wiring pitches by approximately ⅛ in the base substrate forming step (S10 of FIG. 5) than in the configuration in which each of the column data signals Ri, Gi, and Bi is transmitted through one signal line, possibly inviting an increase in manufacturing cost as a result. Furthermore, the thinning of the signal lines leads to rises in interconnection resistance of the signal lines and increases in parasitic capacitance between the wires, thus posing a risk of a delay in the transmission of the signals.

Instead of including the driver IC 90 of the pixel section 3 shown in FIG. 3, the pixel section 3E includes a driver IC 90e including serial/parallel conversion circuits (SPs) 301 to 303, current output circuits (COs) 304 to 306, and test transistors 36 to 39.

The SPs 301 to 303 receive the serial digital signals Ri, Gi, and Bi, respectively, only when the row selection signal Roj is activated to an H level. Upon receiving the serial digital signal Ri, the SP 301 generates a digital output signal corresponding to the emission intensity of the red LED chip 13 and outputs the digital output signal to the COR 304. Upon receiving the serial digital signal Gi, the SP 302 generates a digital output signal corresponding to the emission intensity of the green LED chip 14 and outputs the digital output signal to the COR 305. Upon receiving the serial digital signal Bi, the SP 303 generates a digital output signal corresponding to the emission intensity of the blue LED chip 15 and outputs the digital output signal to the COR 306. The current output circuits (COs) 304 to 306 may be based on a system that controls the amounts of current that flow through the light-emitting elements 13 to 15 according to the emission intensities or may be based on a pulse width modulation system that changes the duration of emission according to the emission intensities.

The COR 304, the COG 305, and the COB 306 continue until the next cycle to output, to the LED chips 13 to 15, electric currents based on the digital signals received from the corresponding SPs, respectively. This causes the LED chips 13 to 15 to emit light at intensities corresponding to the digital signals.

It should be noted that the circuit configurations of the COR 304, the COG 305, and the COB 306 are set according to the emission characteristics and operating voltages of the LED chips to which they output the electric currents. Therefore, if the LED chips 13 to 15 are different in emission characteristic or operating voltage from one another, the COR 304, the COG 305, and the COB 306 are different in circuit configuration from one another.

Note here that in a case where the column data signals Ri, Gi, and Bi are analog signals, the amounts of light that are emitted from the LED chips may fluctuate. This is because, when the amounts of light that are emitted from the LED chips of each pixel section are designated by the analog signals, signal transmission time varies, depending on the position of the row to which the pixel section belongs.

On the other hand, the present embodiment, in which the amounts of light that are emitted by the LED chips of each pixel section are designated by the digital signals, makes it possible to eliminate the cause of output fluctuations depending on the position of a row. This in turn makes it possible to form a more uniform and accurate image.

Ninth Embodiment

Figure 20:
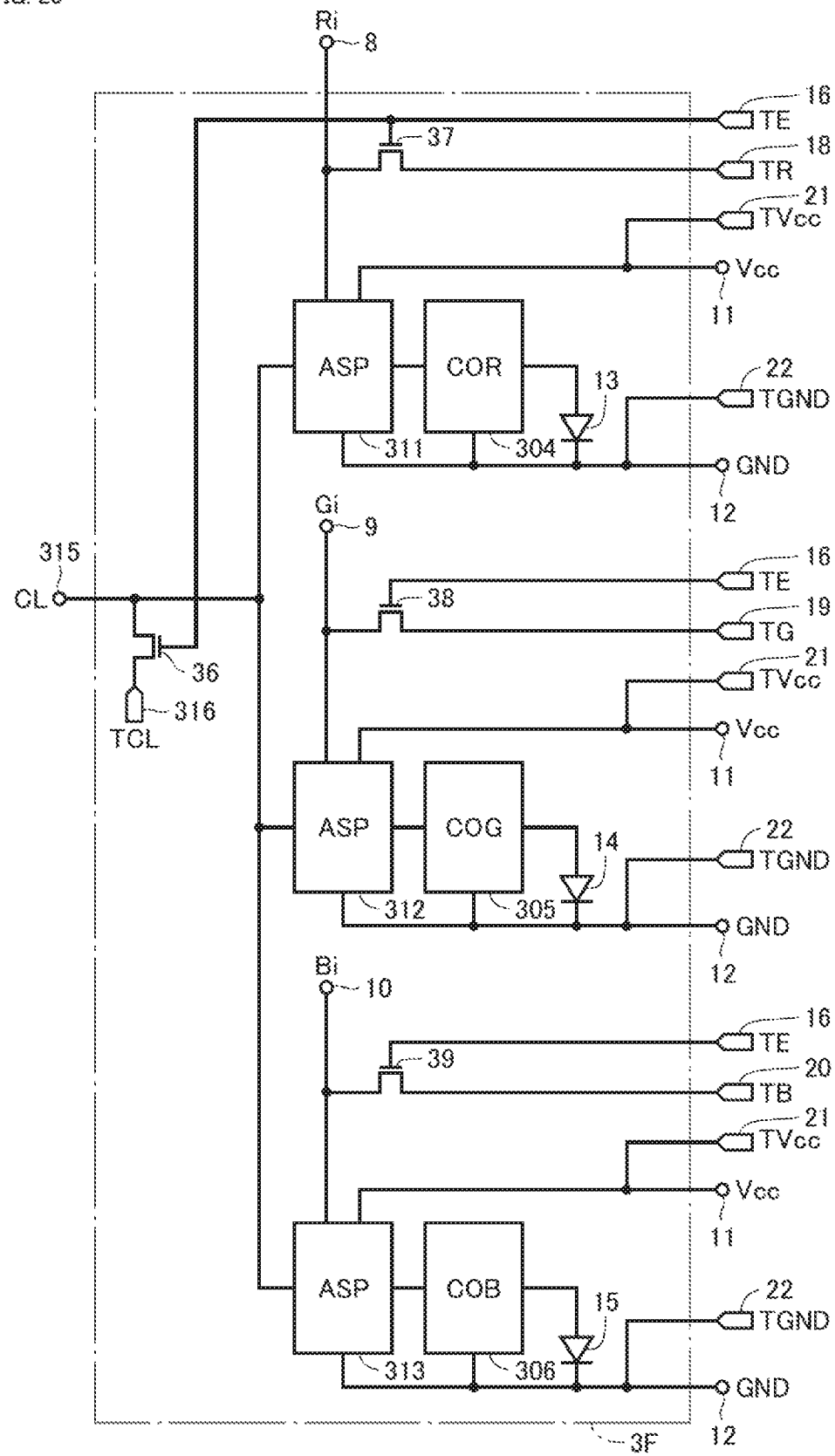
FIG. 20 is a diagram showing a circuit configuration of a pixel section of an image display device according to a ninth embodiment of the present invention.

FIG. 20 is a diagram showing a circuit configuration of a pixel section 3F of an image display device according to the ninth embodiment of the present invention. The basic configuration of the image display device according to the present embodiment is the same as that of the image display device 1 shown in FIG. 1 except for the configuration of the pixel section 3F and, as such, is not described here.

As shown in FIG. 20, the pixel section 3F is identical in basic configuration to the pixel section 3 shown in FIG. 3, except that a row address is added to the column data signals Ri, Gi, and Bi.

Instead of including the driver IC 90 of the pixel section 3 shown in FIG. 3, the pixel section 3F includes a driver IC 90f including addressable serial/parallel conversion circuits (ASPs) 311 to 313, current output circuits (COs) 304 to 306, and test transistors 36 to 39. The COs 304 to 306 are identical in basic configuration to the COs 304 to 306 shown in FIG. 19.

The ASPs 311 to 313 are constructed by using one-time programmable ROMs (OTPROMs). The OPTROMs are one-time writable nonvolatile memories. A 9-bit row address ID representing the address of the row to which the pixel section 3F belongs is written into the OPTROMs in the pixel substrate inspecting step (S40 of FIG. 5). It should be noted that the bit number of the row address ID is set according to the number of rows N of the pixel array section 2 (FIG. 1).

The ASPs 311 to 313 receive the serial digital signals Ri, Gi, and Bi, respectively. Only when the first nine bits of the serial digital signal thus received match the row address ID written in advance does each APS outputs, as a light output signal to the corresponding CO, the remaining part of the digital signal that follows the nine bits. It should be noted that the bit number of the address ID is determined by the number of rows N. In the present embodiment, in which the display is of the VGA standard, the bit number is 9 bits. It should be noted that the bit number of the address ID increases under the high-definition standard and the full high-definition standard.

It should be noted that by inputting a clock signal CL to an input terminal 315 instead of a row selection signal, the present embodiment controls the timing at which each ASP receives the serial digital signal.

The COs 304 to 306 continue until the next cycle to output, to the LED chips 13 to 15, electric currents based on the digital signals received from the corresponding ASPs, respectively.

By adding a signal representing a row address to the column data signals Ri, Gi, and Bi, the present embodiment makes it possible to select a row on the basis of column data signals without using a row selection signal. This eliminates the need for wires through which to transmit a row selection signal. It should be noted that, as with the power line and the column data signal lines, the clock signal CL is formed in the surface of the first wiring layer 111.

In the first to eighth embodiments, which are configured to select a row on the basis of a row selection signal, as shown in FIG. 7, the base substrate 100 has a two-layer wiring structure and the second wiring layer 112 is used to transmit the row selection signal Roj. This has sometimes increased the manufacturing cost of the base substrate 100. On the other hand, the present embodiment, which eliminates the need for such a second wiring layer, makes it possible to reduce the number of wiring layers in the surface of the base substrate 100. This makes it possible to simplify the base substrate forming step (S10 of FIG. 5), making it possible to reduce the manufacturing cost of the base substrate 100 as a result.

It should be noted that, assuming that the original column data signals are composed of eight bits, the amount of a signal that each ASP receives is made approximately twice as large as the original amount of a signal by the addition of the row address ID. It should be noted that the bit numbers of the column data signals may vary among R, G, and B. Further, the bit numbers also vary depending on the accuracy of color representations. Further, each ASP needs to be provided with an OPTROM. For this reason, the present embodiment causes some increase in manufacturing cost of driver ICs. However, it has been confirmed that the present embodiment gives an effect of more reducing the manufacturing cost of base substrates than it increases the cost of driver ICs.

In the present embodiment, the pixel substrate inspecting step (S30 of FIG. 5) includes a new inspection item of confirming that the ASPs 311 to 313 operate upon receiving a row address ID written in advance into the built-in OPTROMs and do not operate upon receiving a row address ID other than the row address ID.

Specifically, after the test mode selection signal TE has been activated to an H level, a test clock signal TCL is inputted to an external connection terminal 316 and the test column data signals TR, TG, and TB including a row address ID are inputted to the ASPs 311 to 312, respectively. In this state, a diagnosis is made as to whether the LED chips 13 to 15 normally emits light. When some LED chip is detected with non-lighting or insufficiency of the amount of light emitted, the pixel section 3 that includes this LED chip is recorded as a defective pixel section. This defective pixel section is removed from the pixel substrate 200 and replaced by another normal pixel section in the bonding step (S40 of FIG. 5).

Tenth Embodiment

Figure 21:
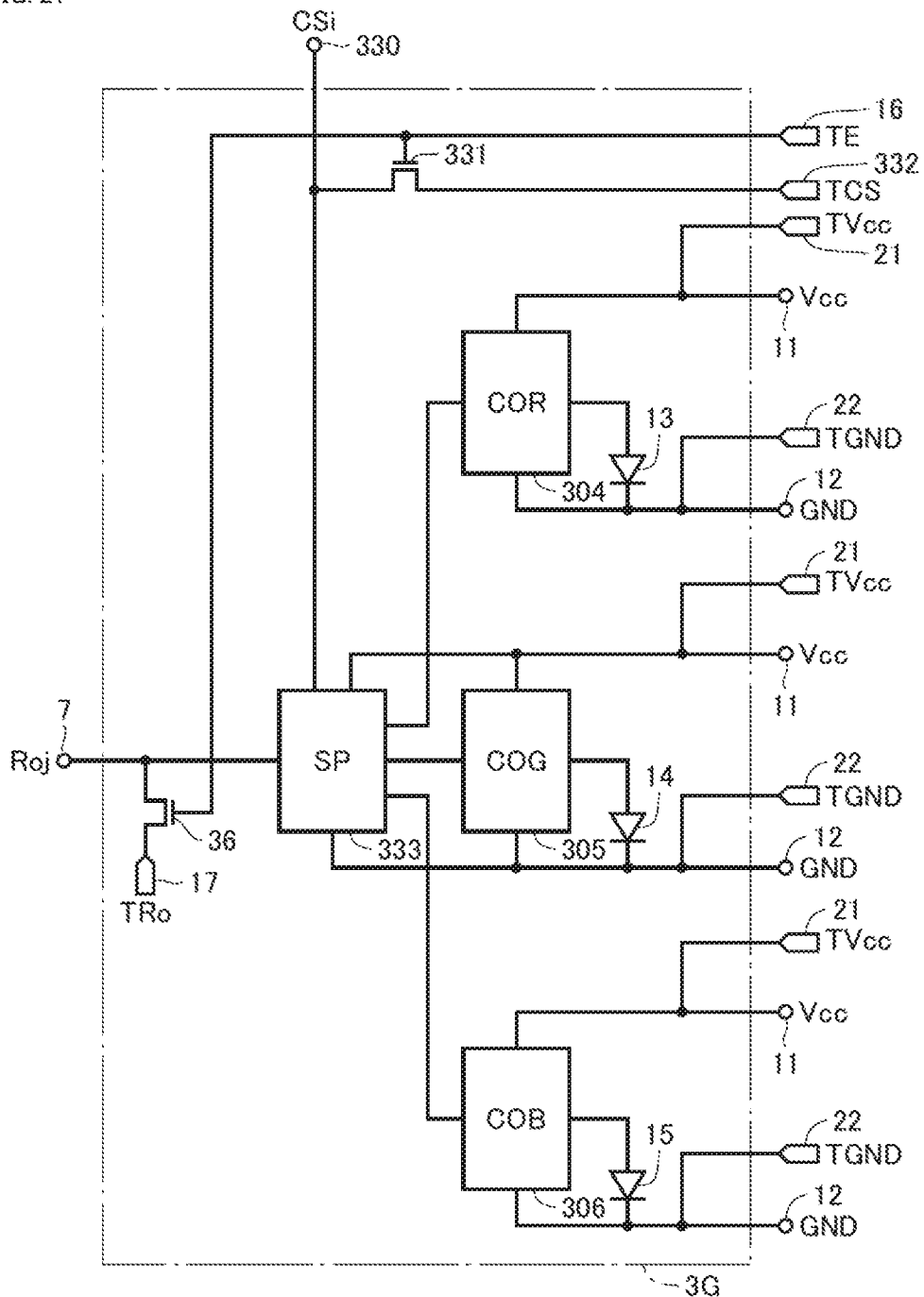
FIG. 21 is a diagram showing a circuit configuration of a pixel section of an image display device according to a tenth embodiment of the present invention.

FIG. 21 is a diagram showing a circuit configuration of a pixel section 3G of an image display device according to the tenth embodiment of the present invention. The basic configuration of the image display device according to the present embodiment is the same as that of the image display device 1 shown in FIG. 1 except for the configuration of the pixel section 3G and, as such, is not described here.

As shown in FIG. 21, the pixel section 3G is identical in basic configuration to the pixel section 3E shown in FIG. 19, except that the column data signals Ri, Gi, and Bi are replaced by a column data signal CSi and the SPs 301 to 303 are replaced by an SP 333. A driver IC 90g includes the SP 333, current output circuits (COs) 304 to 306, and test transistor 36 and 331.

The column data signal CSi is one serial data signal into which the column data signals Ri, Gi, and Bi are combined. The column data signal CSi is supplied to the SP 333 through an input terminal 330.

The SP 333 receives the column data signal CSi only when the row selection signal Roj has been activated to an H level. Upon receiving the column data signal CSi, the SP 333 divides the column data signals Ri, Gi, and Bi, which are transmitted in sequence. The SP 333 outputs the column data signals Ri, Gi, and Bi thus divided to the COs 304 to 306, respectively. The COs 304 to 306 continue until the next cycle to output, to the LED chips 13 to 15, electric currents based on the digital signals received from the corresponding SPs, respectively. This causes the LED chips 13 to 15 to emit light at intensities corresponding to the digital signals.

The test transistor 331 has its gate connected to the external connection terminal 16, its drain connected to the input terminal 330, and its source connected to an input terminal 332. To the input terminal 332, a test column data signal TCS is inputted. As with the column data signal CSi, the test column data signal TCS is one serial data signal into which the test column data signals TR, TG, and TB are combined.

By combining three column data signals Ri, Gi, and Bi into one column data signal CSi, the present embodiment makes it possible to reduce the number of wires of the base substrate 100 through which to transmit column data signals.

In a case where the pixel array section 2 (see FIG. 1) is developed from the full high-definition standard to the 4K high-definition standard or the 8K high-definition standard, the pixel sections 3 need to be smaller in inverse proportion to resolution. This can be dealt with by narrowing the width of the power line through which to supply the power voltage. Meanwhile, this causes the power line to be higher in resistance, thus possibly resulting in a greater voltage drop. With a greater voltage drop, the power voltage is set high to accommodate this drop. This raises the need to design driver ICs to be able to operate even at high voltage, thus possibly increasing the manufacturing cost of driver ICs.

By reducing the number of signals through which column data signals are transmitted, the present embodiment makes it possible to eliminate the need to narrow the width of the power line. This in turn makes it possible to suppress the rise in manufacturing cost of driver ICs.

Eleventh Embodiment

Figure 22:
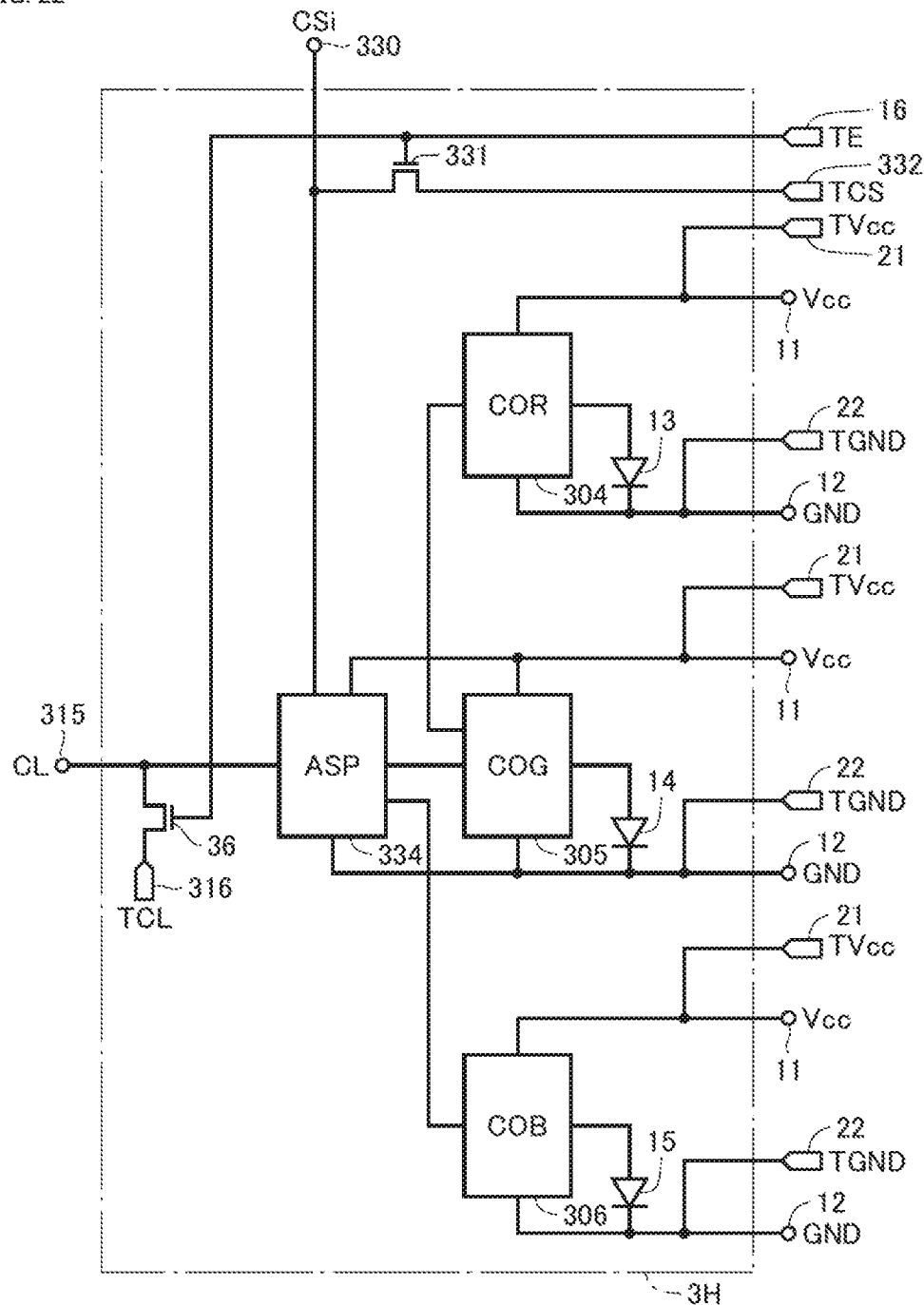
FIG. 22 is a diagram showing a circuit configuration of a pixel section of an image display device according to an eleventh embodiment of the present invention.

FIG. 22 is a diagram showing a circuit configuration of a pixel section 3H of an image display device according to the eleventh embodiment of the present invention. The basic configuration of the image display device according to the present embodiment is the same as that of the image display device 1 shown in FIG. 1 except for the configuration of the pixel section 3H and, as such, is not described here.

As shown in FIG. 22, the pixel section 3H is identical in basic configuration to the pixel section 3G shown in FIG. 21, except that the SP 333 is replaced by an addressable serial/parallel conversion circuit (ASP) 334. A driver IC 90h includes the ASP 334, current output circuits (COs) 304 to 306, and test transistor 36 and 331.

The ASP 334 is constructed by using an OTPROM. A row address ID representing the address of the row to which the pixel section 3H belongs is written into the OPTROM in the pixel substrate inspecting step (S40 of FIG. 5).

The ASP 334 receives the column data signal CSi only when the row selection signal Roj has been activated to an H level. In the present embodiment, the column data signal CSi is one obtained by combining the column data signals Ri, Gi, and Bi into one serial data signal and adding a signal representing the row address ID to the head of the serial data signal.

Upon receiving the column data signal CSi, the ASP 334 divides the column data signals Ri, Gi, and Bi, which are transmitted in sequence, only when the first nine bit of the signal CSi thus received match the row address ID written in advance. The ASP 334 outputs the column data signals Ri, Gi, and Bi thus divided to the COs 304 to 306, respectively. The COs 304 to 306 continue until the next cycle to output, to the LED chips 13 to 15, electric currents based on the digital signals received from the ASP 334, respectively. This causes the LED chips 13 to 15 to emit light at intensities corresponding to the digital signals.

The pixel section 3H according to the present embodiment makes it possible to bring about both the working effect of the tenth embodiment described above and the working effect of the ninth embodiment described above. That is, the pixel section 3H according to the present embodiment makes it possible to prevent light output signals from deteriorating due to transmission delay and attenuation of analog signals within long column signal lines and to reduce the manufacturing cost of base substrates. This in turn makes it possible to provide a structure that is effective in attaining higher luminance.

Twelfth Embodiment

A twelfth embodiment describes another method for repairing a defective pixel section.

Figure 23:
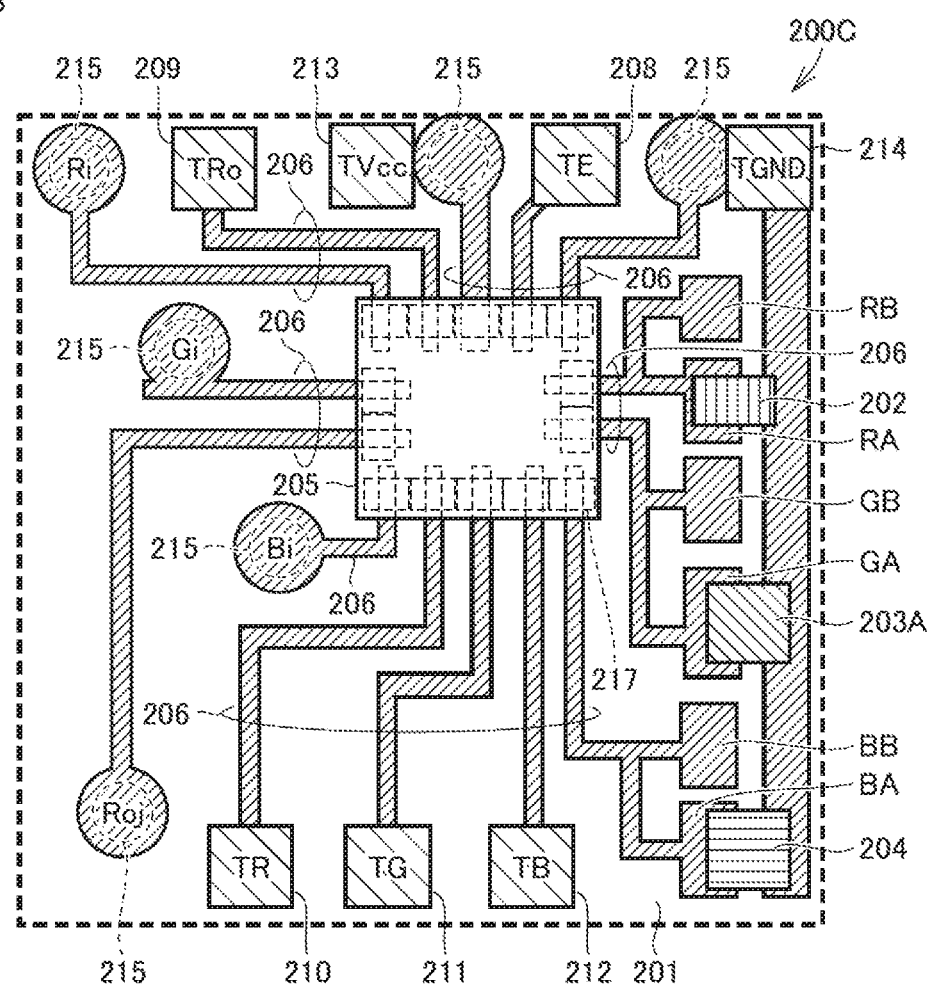
FIG. 23 is a plan view of a pixel substrate of an image display device according to a twelfth embodiment of the present invention.
Figure 24:
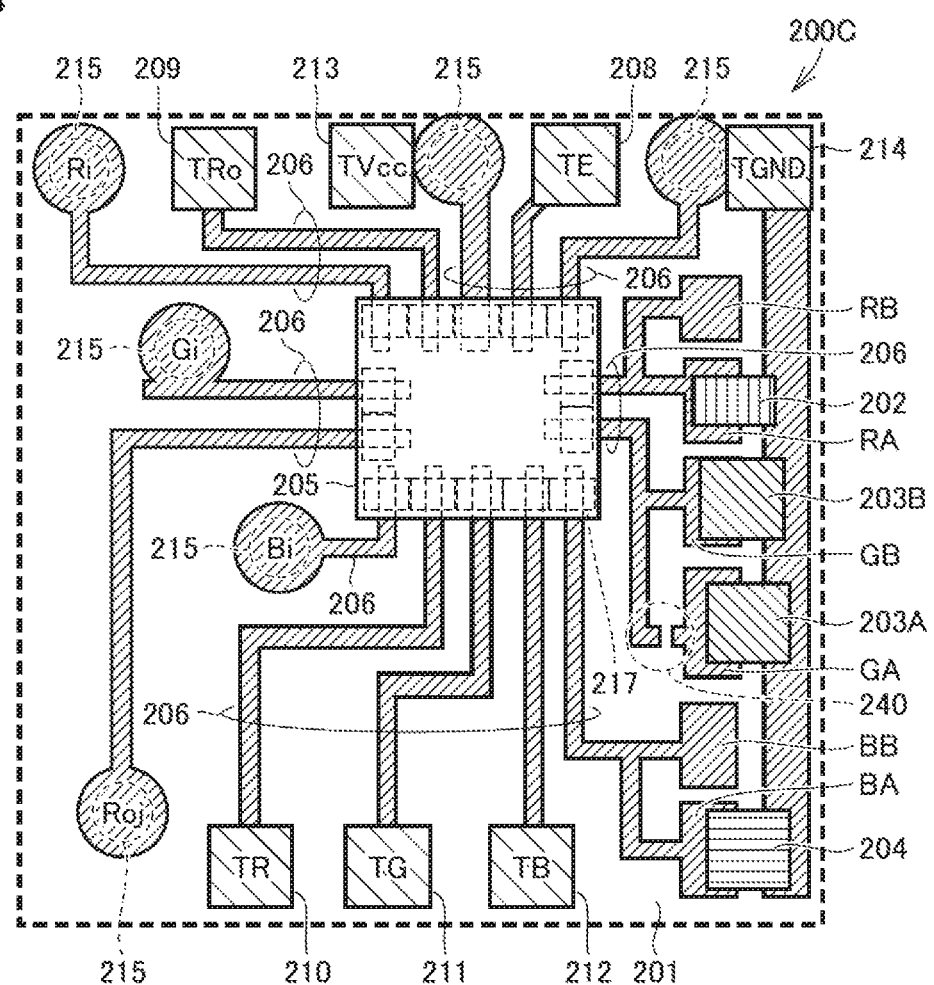
FIG. 24 is a plan view of the pixel substrate of the image display device according to the twelfth embodiment of the present invention.

FIGS. 23 and 24 are plan views of a pixel substrate 200C of an image display device according to the twelfth embodiment of the present invention. The basic configuration of the image display device according to the present embodiment is the same as that of the image display device 1 shown in FIG. 1 except for the configuration of the pixel substrate 200C and, as such, is not described here.

As shown in FIG. 23, the pixel substrate 200C is identical in basic configuration to the pixel substrate 200 shown in FIG. 8, except that each of the LED chips is mounted on two connection pads.

Comparatively highly frequent modes of defects among defects in pixels are defects in light-emitting elements. Defects in light-emitting elements are defects among defects such as leak defects, conduction defects, and harmony defects that are caused due to light-emitting elements. It should be noted that a leak defect means that there is a leak between the anode and cathode of a light-emitting element. A conduction defect means that either the anode or cathode of a light-emitting element is nonconducting due to a broken wire or a bad contact. A harmony defect means that the amount of light that is emitted by a light-emitting element is lower or higher than the set value.

The method for repairing a defective pixel section according to the present embodiment deals with such a defect in a light-emitting element. Specifically, a pixel substrate is provided with a spare circuit, and in a case where a defect in a light-emitting element has been detected, the pixel substrate is newly mounted with a replacement light-emitting element and then the circuit is switched so that the replacement light-emitting element and the driver IC 205 are electrically connected to each other.

As shown in FIG. 23, the pixel substrate 200C includes pads RA and RB serving as red LED chip connection pads, pads GA and GB serving as green LED chip connection pads, and pads BA and BB serving as blue LED chip connection pads. In the pixel substrate forming step (S20 of FIG. 5), the red LED chip 202 is mounted on the pad RA, a green LED chip 203A is mounted on the pad GA, and the blue LED chip 204 is mounted on the pad BA.

Suppose a case where a lighting defect has occurred, for example, in the green LED chip 203A in the pixel substrate inspecting step (S30 of FIG. 5), which is executed after the pixel substrate 200C has been formed. In such a case, as shown in FIG. 24, a replacement green LED chip 203B is mounted on the pad GB. Furthermore, a portion (which is equivalent to a region 240 in the drawing) of the wiring pattern 206 that leads to the pad GA on which the defective green LED chip 203A is mounted is cut off. It should be noted that in the case of such a defect that no electric current flows through the green LED chip 203A, it is unnecessary to cut off the wiring pattern 206. The wiring pattern 206 can be easily cut off, for example, by laser light irradiation.

After the end of the foregoing operation, the emission characteristics of the green LED chip is inspected again. If the green LED chip 203B normally emits light, the repair is completed.

Meanwhile, in a case where the green LED chip 203B does not normally emit light, it is determined that the driver IC 205 is highly likely to be abnormal. In this case, the pixel section that include the green LED chip 203B is totally removed from the pixel substrate 200C and replaced by a normal pixel section.

The aforementioned method for repairing a light-emitting element may be replaced by a method including removing the defective green LED chip 203A from the pixel substrate 200C and mounting the replacement green LED chip 203B in the part from which the defective green LED chip 203A has been removed. This method does not require the aforementioned spare circuit and therefore does not increase the area of the wiring patterns 206. However, on the other hand, since it is difficult to remove an LED chip without damaging a connection pad, the method shown in FIGS. 23 and 24 is advantageous in terms of simplicity.

Therefore, in the case of a pixel substrate having a sufficient area, a defective LED chip can be repaired simply and quickly by providing spare wires and connection pads as shown in FIGS. 23 and 24. Further, since repairs can be made for each individual LED chip, a normal driver IC and other LED chips can be used even after repairs without being discarded.

It should be noted that although the present embodiment employs a method of physically cutting off a wiring pattern that leads to a defective LED chip, it is alternatively possible to allow the driver IC 205 to have a function of switching LED chips.

Specifically, wiring patterns are provided which lead from the driver IC 205 to the pads RA, RB, GA, GB, BA, and BB, respectively. For example, in a case where the green LED chip 203A is defective, the green LED chip 203B is mounted on the pad GB and the operation of the driver IC 205 is changed so that an electric current flows through the green LED chip 203B. Note, however, that a nonvolatile memory for selecting which of the green LED chips 203A and 203B to pass an electric current through is needed to change the operation of the driver IC 205. On the other hand, the operation of physically cutting off a wire can be eliminated.

Alternatively, instead of providing each of the LED chips with two connection pads, it is possible to provide a single fourth connection pad that the three LED chips share with one another. The fourth connection pad is mounted with an LED chip that serves as a replacement for an LED chip in which a defect has appeared. Such a method is effective in the case of a pixel section without a sufficient area.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 Image display device (display)
2 Pixel array section
3, 3A to 3H Pixel section
4 Row selection circuit
5 Column signal output circuit
6 Image processing circuit
7 to 12, 76, 77 Input terminal
13, 13a, 13b, 202 Red LED chip
14, 14a, 14b, 203 Green LED chip
15, 15a, 15b, 204 Blue LED chip
16 to 22, 79, 80, 332 External connection terminal
23 to 25 Driving section
27 to 29 Selection transistor
30 to 32, 56 to 58 Driving transistor
33 to 35, 59 to 61 Storage capacitor
36 to 39 Test transistor
40, 45 Blue-violet LED chip
41 Red phosphor
46 Green phosphor
63 to 65 Switching transistor
70 to 75 LED selection transistor
78 OR circuit
90, 90a to 90h Driver IC
100 Base substrate
101 Power line
102 Earth line
103 to 105 Column data signal line
106 Interlayer insulating film
107 Row selection signal line
108 Terminal area
110 Film substrate
111 First wiring layer
112 Second wiring layer
200 Pixel substrate
205 Driver IC
206 Wiring pattern
208 to 214 External connection pad
215 Via hole
216 Anisotropic conductive adhesive
217 Connection pad
220 Conductive paste
230 Substrate
231 Nitride semiconductor epitaxial layer
232 Mesa part
233 Transparent electrode
234 Transparent protective film
235 P-side electrode
236 N-side electrode
240 Wiring repair part
301 to 303, 333 SP
304 COR
305 COG
306 COB
311 to 313, 334 ASP

The invention claimed is:

1. An image display device formed by two-dimensionally arraying a plurality of pixel sections, comprising:
    a base substrate; and
    a plurality of pixel substrates, arranged over the base substrate, each of which constitutes at least one of the pixel sections,
    wherein the base substrate includes
        a first substrate having a first principal surface and a second principal surface located on a side opposite to the first principal surface, and
        a first wiring member placed over the first or second principal surface, the first wiring member having a first wiring layer,
    each of the pixel substrates includes
        a second substrate having a third principal surface and a fourth principal surface located on a side opposite to the third principal surface, a plurality of light-emitting elements mounted over the third principal surface, a driver IC, mounted over the third principal surface, which has a function of driving the plurality of light-emitting elements, and a second wiring member, placed on the third principal surface, which is electrically connected to the plurality of light-emitting elements, the driver IC, the second substrate is disposed to be stacked on top of the first substrate so that the first principal surface and the fourth principal surface face each other, and the second wiring member is electrically connected to the first wiring layer.

2. The image display device according to claim 1, wherein each of the pixel substrates has a connection pad on which to mount a replacement light-emitting element in a case where any of the plurality of light-emitting elements is defective.

3. The image display device according to claim 1, wherein the first wiring member having a second wiring layer disposed to partially overlap the first wiring layer in a plan view.

4. The image display device according to claim 1, wherein each of the pixel substrates includes a via hole bored through the second substrate and the via hole is electrically connected to the second wiring member.

5. The image display device according to claim 1, wherein in the pixel substrates, an inspection as to whether emission characteristics of the plurality of light-emitting elements are normal is performed for each of the pixel sections, and in any of the pixel substrates that includes a defective section in which either a light-emitting element or the driver IC is not normal in the emission characteristics, the defective pixel section is removed from the pixel substrate and replaced by a replacement pixel section.

6. The image display device according to claim 1, wherein the second substrate is film substrate having flexibility.

7. The image display device according to claim 1, wherein the first wiring layer continues in the pixel sections without interruption.

8. The image display device according to claim 3, wherein the second wiring layer continues in the pixel sections without interruption.

9. The image display device according to claim 1, wherein the first wiring layer include either of a power line, a ground line, a row selection line, or a column data line.

10. The image display device according to claim 3, wherein the first wiring layer and the second wiring layer include a power line, a ground line, a row selection line, and a column data line.

11. The image display device according to claim 3, wherein the first wiring layer includes the power line, the ground line, and the column data line.

12. The image display device according to claim 11, wherein the second wiring layer includes the row selection line.

13. The image display device according to claim 3, wherein the second wiring layer is formed on an upper side of the first wiring layer in a thickness direction of the first substrate, the first wiring member includes an insulating layer disposed between the first wiring layer and the second wiring layer, and the insulating layer is formed to cover some regions of the first wiring layer and includes at least regions of the second wiring layer.

14. The image display device according to claim 1, wherein the second wiring member has a disconnection between adjacent ones of the pixel sections.

15. The image display device according to claim 2, wherein the driver IC has a switching function of passing an electric current through the connection pad in a case where the replacement light-emitting element has been mounted.

16. The image display device according to claim 1, wherein each of the pixel substrates includes a plurality of external connection terminals, formed over the third principal surface, through which to receive pixel test input signals that are supplied from outside the pixel substrate, the driver IC has a function of testing operating performance of the pixel section, and the driver IC is connected to the plurality of external connection terminals via the second wiring member.

17. The image display device according to claim 16, wherein the plurality of external connection terminals receive a test mode selection signal, a test power voltage, a test ground voltage, a test row selection signal, and a test column data signal, respectively.

18. The image display device according to claim 16, wherein the driver IC is mounted with a test transistor that makes the plurality of external connection terminals effective when the test mode selection signal is activated.

19. The image display device according to claim 17, wherein one of the plurality of external connection terminals that receives the test row selection signal and one of the plurality of external connection terminals that receives the test column data signal are electrically disconnected from a row selection line and a column data line.

20. The image display device according to claim 17, wherein one of the plurality of external connection terminals that receives the test mode selection signal is electrically connected to a ground line or a power line.

* * * * *